US012635382B2

(12) United States Patent
Yi et al.

(10) Patent No.: US 12,635,382 B2
(45) Date of Patent: May 19, 2026

(54) DISPLAY DEVICE

(71) Applicant: Samsung Display Co., LTD., Yongin-si (KR)

(72) Inventors: Jung Hwan Yi, Yongin-si (KR); Soo Dong Kim, Yongin-si (KR); Su Jeong Kim, Yongin-si (KR); Young Jae Kim, Yongin-si (KR); Je Won Yoo, Yongin-si (KR); Jung Woo Lee, Yongin-si (KR); Jung Min Choi, Yongin-si (KR); Jong Beom Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/983,674

(22) Filed: Dec. 17, 2024

(65) Prior Publication Data

US 2025/0366341 A1     Nov. 27, 2025

(30) Foreign Application Priority Data

May 22, 2024     (KR) ......................... 10-2024-0066560

(51) Int. Cl.
*G06F 3/044*     (2006.01)
*H10K 59/122*     (2023.01)
*H10K 59/40*     (2023.01)
*H10K 59/80*     (2023.01)

(52) U.S. Cl.
CPC ........... *H10K 59/40* (2023.02); *G06F 3/0443* (2019.05); *H10K 59/122* (2023.02); *H10K 59/873* (2023.02); *H10K 59/878* (2023.02); *H10K 59/8792* (2023.02)

(58) Field of Classification Search
CPC .... G06F 3/0443; G06F 3/0412; G06F 3/0445; G06F 3/041; H10K 50/80; H10K 59/00; H10K 50/865; H10K 59/38; H10K 59/40
See application file for complete search history.

(56) References Cited

U.S. PATENT DOCUMENTS

| | | | |
|---|---|---|---|
| 10,971,557 B2 | 4/2021 | Jeong et al. | |
| 2017/0090634 A1* | 3/2017 | Yang | H10K 59/873 |
| 2018/0197921 A1* | 7/2018 | Kim | H10K 59/8792 |
| 2020/0212111 A1* | 7/2020 | Kim | H10K 59/38 |
| 2021/0397806 A1* | 12/2021 | Lu | G06V 10/143 |
| 2023/0168755 A1* | 6/2023 | Lee | H10K 59/88 345/174 |
| 2023/0276681 A1* | 8/2023 | Kim | H10K 59/38 |

FOREIGN PATENT DOCUMENTS

| | | |
|---|---|---|
| KR | 1020180082661 A | 7/2018 |
| KR | 1020200080729 A | 7/2020 |
| KR | 1020220093832 A | 7/2022 |

* cited by examiner

*Primary Examiner* — Md Saiful A Siddiqui
(74) *Attorney, Agent, or Firm* — CANTOR COLBURN LLP

(57) ABSTRACT

A display device includes a display layer including a light-emitting element and a pixel-defining layer, a touch sensing layer disposed on the display layer and including a touch insulating layer and a reflective pattern, and a light-blocking pattern disposed on the touch sensing layer and including a first pattern overlapping the pixel-defining layer and a second pattern overlapping the reflective pattern, where the reflective pattern and the second pattern each have a vertical length and a horizontal length different from each other in a plan view.

21 Claims, 22 Drawing Sheets

CFL: CF1, CF2, CF3, BM
RP: RPL1, RPL2, RPL3
BP2: LAP1, LAP2, LAP3
BM: BP1, BP2

MA    NDA

100

SBA

10

200

400

300

DR3
DR2    DR1

BM: BP1, BP2
BP2: LAP1, LAP2, LAP3, LAP4

CFL: CF1, CF2, CF3, BM
RP: RPL1, RPL2, RPL3
BP2: LAP1, LAP2, LAP3
BM: BP1, BP2

DR3

DISTANCE BETWEEN REFLECTIVE PATTERN
AND COMMON ELECTRODE

DISPLAY DEVICE

This application claims priority to Korean Patent Application No. 10-2024-0066560, filed on May 22, 2024, and all the benefits accruing therefrom under 35 U.S.C. § 119, the content of which in its entirety is herein incorporated by reference.

BACKGROUND

1. Field

Embodiments of the disclosure relate to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions.

Display devices may be flat panel display devices such as a liquid-crystal display device, a field emission display device, and a light-emitting display device. Light-emitting display devices include an organic light-emitting display device including organic light-emitting elements, an inorganic light-emitting display device including inorganic light-emitting elements such as inorganic semiconductor, and a micro light-emitting display device including micro light-emitting elements.

An organic light-emitting element may include two opposing electrodes and an emissive layer interposed therebetween. Electrons and holes supplied from the two electrodes are recombined in the emissive layer to generate excitons, and the generated excitons relax from the excited state to the ground state so that light can be emitted.

An organic light-emitting display device including organic light-emitting elements includes no separate light source such as a backlight unit, and thus the organic light-emitting display device consumes less power and can be made light and thin, as well as exhibiting high-quality characteristics such as wide viewing angle, high luminance and contrast, and fast response speed. Accordingly, an organic light-emitting display device is attracting attention as the next generation display device.

SUMMARY

Embodiments of the disclosure provide a display device that can decrease the reflectance of external light and improve the efficiency.

It would be understood that embodiments of the disclosure are not limited to the above-mentioned embodiment; and other embodiments of the disclosure will be apparent to those skilled in the art from the following descriptions.

According to an embodiment of the disclosure, a display device includes a display layer including a light-emitting element and a pixel-defining layer, a touch sensing layer disposed on the display layer and including a touch insulating layer and a reflective pattern, and a light-blocking pattern disposed on the touch sensing layer and including a first pattern overlapping the pixel-defining layer and a second pattern overlapping the reflective pattern, where the reflective pattern and the second pattern each have a vertical length and a horizontal length different from each other in a plan view.

In an embodiment, the pixel-defining layer may define an emission area and a non-emission area, and the reflective pattern and the second pattern may overlap the emission area.

In an embodiment, the first pattern may not overlap the emission area, and the first pattern may overlap the non-emission area.

In an embodiment, the touch sensing layer may include a driving electrode disposed on the touch insulating layer, and the driving electrode and the reflective pattern may be disposed in a same layer as each other.

In an embodiment, the touch sensing layer may include a driving electrode, a sensing electrode and a bridge electrode, and the reflective pattern may be spaced apart from the driving electrode, the sensing electrode and the bridge electrode in the plan view.

In an embodiment, an area of the reflective pattern may be equal to an area of the second pattern.

In an embodiment, a shape of the reflective pattern may be identical to a shape of the second pattern in the plan view.

In an embodiment, the reflective pattern and the second pattern may each have a vertical length greater than the horizontal length in the plan view.

In an embodiment, a width of the reflective pattern in a direction may be less than a width of the second pattern in the direction.

In an embodiment, an area of the reflective pattern may be less than an area of the second pattern.

In an embodiment, the touch insulating layer may include a trench formed in an upper surface, and the reflective pattern may be disposed on the trench.

In an embodiment, the display layer may include a thin-film encapsulation layer disposed between the light-emitting element and the touch sensing layer, the touch sensing layer may include a bridge electrode disposed between the thin-film encapsulation layer and the touch insulating layer, and the bridge electrode and the reflective pattern may be disposed in a same layer as each other.

In an embodiment, the second pattern may be spaced apart from the first pattern and is surrounded by the first pattern in the plan view.

In an embodiment, the light-emitting element may include a pixel electrode, the pixel-defining layer may be provided with an opening exposing the pixel electrode, and the reflective pattern may be disposed in a central area of the opening of the pixel-defining layer in the plan view.

In an embodiment, the vertical length of the reflective pattern may be less than or equal to a distance between opposing sides of the pixel-defining layer, which are opposite to each other in an extension direction of the vertical length.

According to an embodiment of the disclosure, a display device includes a display layer including an emission area and a non-emission area, a touch sensing layer disposed on the display layer and including a driving electrode overlapping the non-emission area and a reflective pattern overlapping the emission area, and a light-blocking pattern disposed on the touch sensing layer and including a first pattern overlapping the non-emission area and a second pattern overlapping the emission area, where the reflective pattern and the second pattern each have a vertical length greater than a horizontal length in a plan view.

In an embodiment, an area of the reflective pattern may be equal to an area of the second pattern.

In an embodiment, an area of the reflective pattern may be less than an area of the second pattern.

In an embodiment, a shape of the reflective pattern may be identical to a shape of the second pattern when viewed from top.

In an embodiment, the touch sensing layer may include a touch insulating layer disposed on the display layer, and the driving electrode and the reflective pattern may be disposed directly on the touch insulating layer.

According to an embodiment of the disclosure, an electronic device, comprises a display device configured to provide an image, a processor configured to provide an image data signal to the display device, a memory configured to store a data information for operation, and a power module configured to generate power, a display device comprises a display layer including a light-emitting element and a pixel-defining layer, a touch sensing layer disposed on the display layer and including a touch insulating layer and a reflective pattern, and a light-blocking pattern disposed on the touch sensing layer and including a first pattern overlapping the pixel-defining layer and a second pattern overlapping the reflective pattern, where the reflective pattern and the second pattern each have a vertical length and a horizontal length different from each other in a plan view.

According to an embodiment of the disclosure, the reflectance of external light may be decreased and the efficiency may be improved in a display device, in which a second pattern of a light-blocking pattern and a reflective each have vertical and horizontal lengths different from each other.

It would be understood that effects of the disclosure are not limited to those described above and other effects of the disclosure will be apparent to those skilled in the art from the following descriptions.

BRIEF DESCRIPTION OF THE DRAWINGS

The above and other features of embodiments of the disclosure will become more apparent by describing in detail embodiments thereof with reference to the attached drawings, in which:

FIG. 2 is a perspective view showing a foldable display device according to an embodiment of the disclosure when the foldable display device is in a folded state.

FIG. 4 is a perspective view showing a display device included in an electron device according to an embodiment of the disclosure.

DETAILED DESCRIPTION

Figure 1:
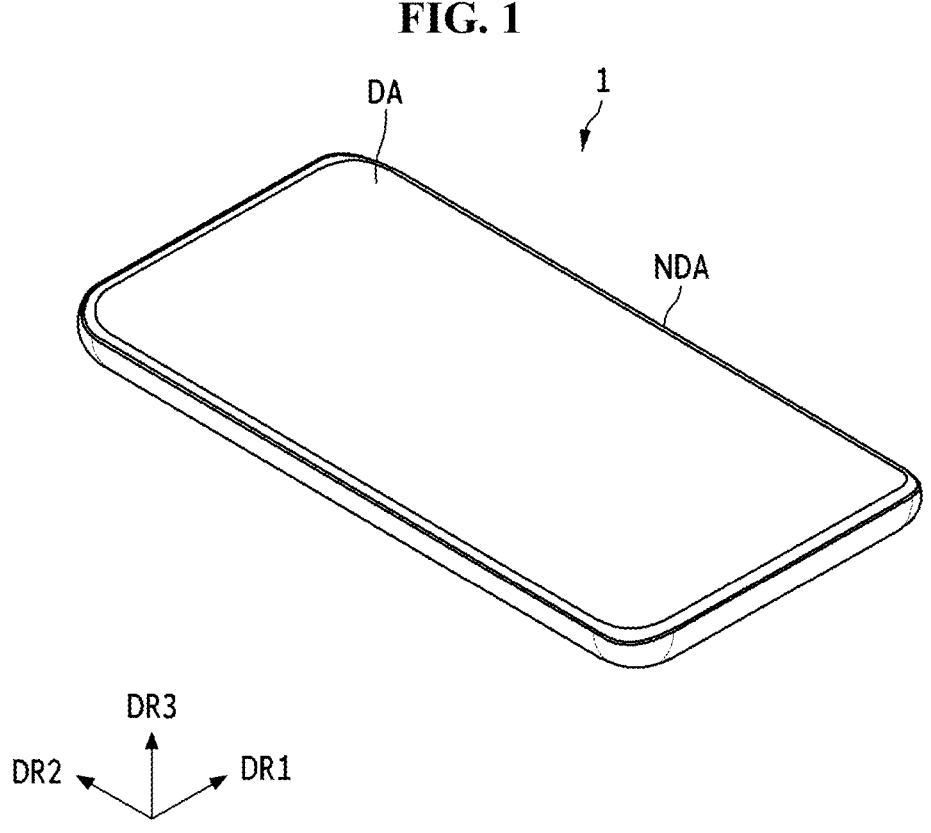
FIG. 1 is a perspective view of an electronic device according to an embodiment of the disclosure.

The invention will now be described more fully hereinafter with reference to the accompanying drawings, in which various embodiments are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present therebetween. In contrast, when an element is referred to as being "directly on" another element, there are no intervening elements present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings herein. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

FIG. 1 is a perspective view of an electronic device according to an embodiment of the disclosure.

Referring to FIG. 1, an embodiment of an electronic device 1 displays a moving image or a still image. The electronic device 1 may refer to any electronic device that provides a display screen. In an embodiment, for example, the electronic device 1 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The electronic device 1 may include a display device 10 (see FIG. 4) for providing a display screen. Examples of the display device may include an inorganic light-emitting diode display device, an organic light-emitting display device, a quantum-dot light-emitting display device, a plasma display device, a field emission display device, etc. In the following description, embodiments where the display device is an organic light-emitting diode display device will be mainly described as an example, but the disclosure is not limited thereto. Any other types of display device may be employed as long as the technical idea of the disclosure can be equally applied.

The shape of the electron device 1 may be modified in a variety of ways. In an embodiment, for example, the electron device 1 may have shapes such as a rectangle with longer lateral sides, a rectangle with longer vertical sides, a square, a quadrangle with rounded corners (vertices), other polygons, a circle, etc. The shape of a display area DA of the electron device 1 may also be similar to the overall shape of the electron device 1. In an, as shown in FIG. 1, the electron device 1 may have a rectangular shape with the longer sides in a second direction DR2.

The electronic device 1 may include the display area DA and a non-display area NDA. In the display area DPA, images can be displayed. In the non-display area NDA, images are not displayed. The display area DPA may be referred to as an active area, while the non-display area NDA may also be referred to as an inactive area. The display area DA may generally occupy the center of the electronic device 1.

Figure 2:
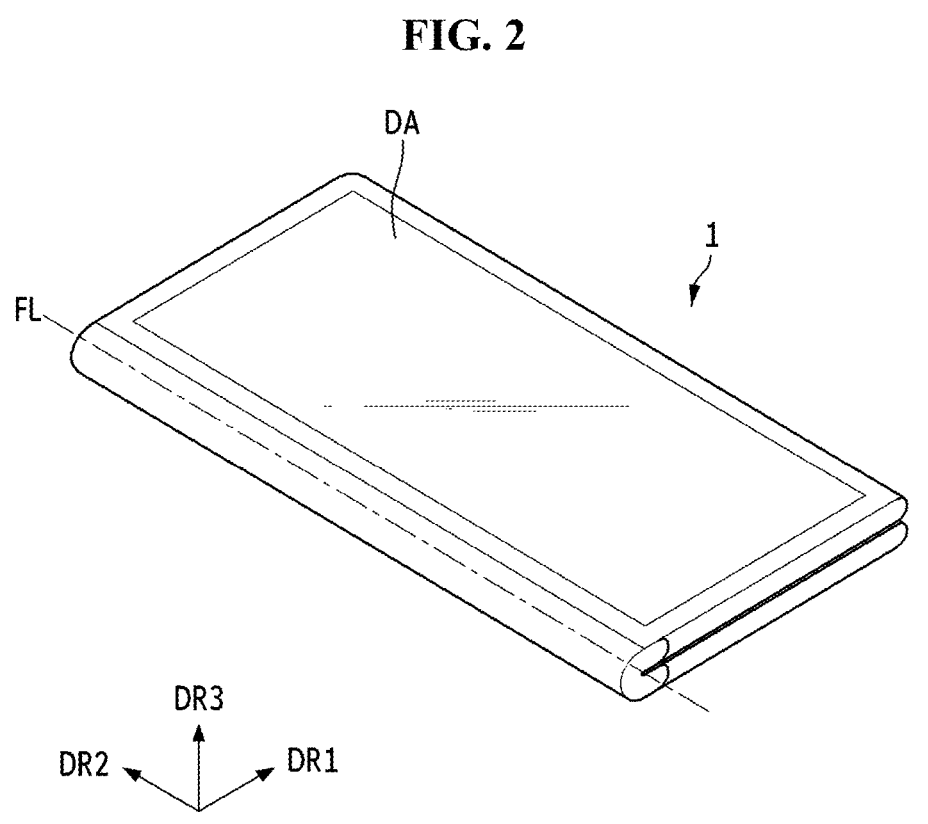
Figure 3:
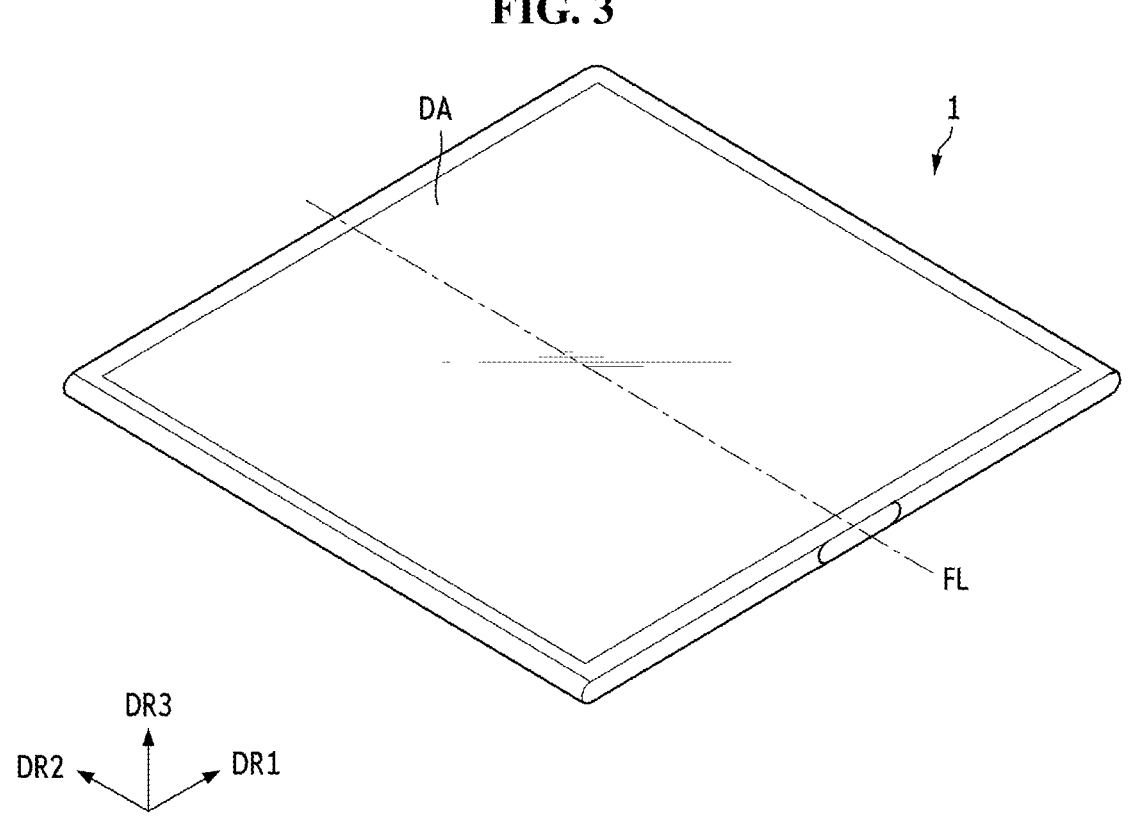
FIG. 3 is a perspective view showing the foldable display device of FIG. 2 when the foldable display device is in an unfolded state.

FIG. 2 is a perspective view showing a foldable display device according to an embodiment of the disclosure when the foldable display device is in a folded state. FIG. 3 is a perspective view showing the foldable display device of FIG. 2 when the foldable display device is in an unfolded state.

Referring to FIGS. 2 and 3, an electronic device 1 according to an embodiment may be a foldable display device. The foldable electronic device 1 may be folded along a folding axis FL. The display area DA may be located on the outside and/or inside of the foldable electronic device 1. According to an embodiment, as shown in FIGS. 2 and 3, the display area DA is disposed on each of the outside and inside of the foldable electronic device 1.

The display area DA may be disposed on the outer side of the foldable electronic device 1. The outer surface of the electronic device 1 when the foldable electronic device 1 is folded may include the display area DA, and the inner surface of the electronic device 1 when it is unfolded may include the display area DA.

Figure 4:
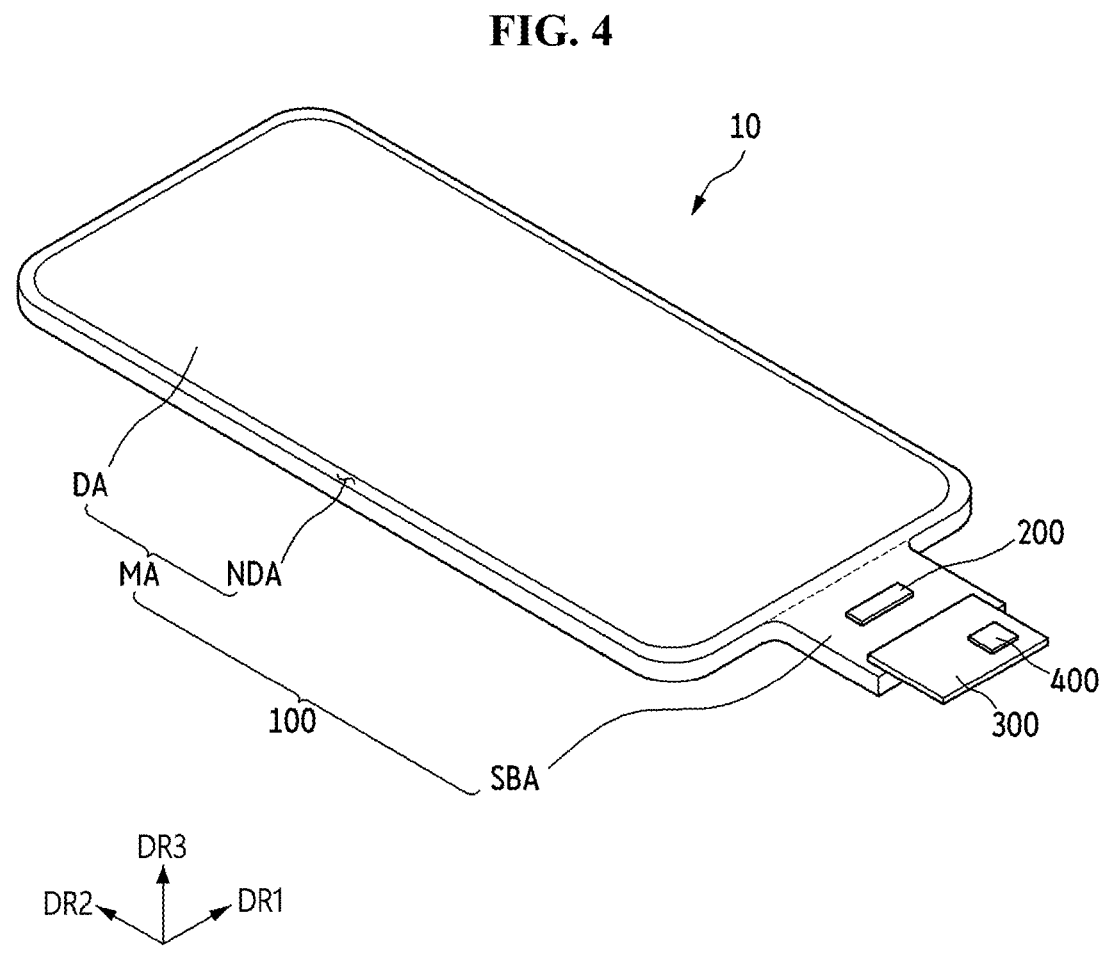

FIG. 4 is a perspective view showing a display device included in an electron device according to an embodiment of the disclosure.

Referring to FIG. 4, the electron device 1 according to an embodiment of the disclosure may include a display device 10. The display device 10 may provide a display screen where images are displayed in the electron device 1. The display device 10 may have a shape similar to that of the electronic device 1 in a plan view, i.e., when viewed from the top or when viewed in a third direction DR3. Here, the third direction DR3 may be a thickness direction of the display device 10 or the electronic device 1. In an embodiment, for example, the display device 10 may have a shape similar to a rectangle having shorter sides in a first direction DR1 and longer sides in a second direction DR2. Here, the third direction may be perpendicular to the first direction DR1 and the second direction DR2. The corners where the shorter sides in the first direction DR1 meet the longer sides in the second direction DR2 may be rounded with a predetermined curvature. It should be understood, however, that the disclosure is not limited thereto. The corners may be formed at a right angle. The shape of the display device 10 in a plan view is not limited to a quadrangular shape, but may be formed in a shape similar to other polygonal shapes, a circular shape, or an elliptical shape.

In an embodiment, the display device 10 may include a display panel 100, a display driver 200, a circuit board 300 and a touch driver 400.

The display panel 100 may include a main area MA and a subsidiary area SBA.

The main area MA may include the display area DA including pixels for displaying images, and the non-display area NDA located around the display area DA and including no pixel herein. The display area DA may output lights from a plurality of emission areas or a plurality of open areas. In an embodiment, for example, the display panel 100 may include a pixel circuit including switching elements, a pixel-defining layer that defines the emission areas or the open areas, and self-light-emitting elements.

In an embodiment, for example, the self-light-emitting element may include, but is not limited to, at least one selected from: an organic light-emitting diode including an organic emissive layer, a quantum-dot light-emitting diode (quantum LED) including a quantum-dot emissive layer, an inorganic light-emitting diode (inorganic LED) including an inorganic semiconductor, and a micro light-emitting diode (micro LED).

The non-display area NDA may be located on the outer side of the display area DA. The non-display area NDA may be defined as the edge of the main area MA of the display panel 100. The non-display area NDA may include a gate driver (not shown) that applies gate signals to gate lines, and fan-out lines (not shown) that connect the display driver 200 with the display area DA.

The subsidiary area SBA may extend from one side of the main area MA. The subsidiary area SUB may include a flexible material that can be bent, folded, or rolled. In an embodiment, for example, when the subsidiary area SBA is bent, the subsidiary area SBA may overlap the main area MA in a thickness direction (or the third direction DR3). The subsidiary area SBA may include pads connected to the display driver 200 and the circuit board 300. According to another embodiment, the subsidiary area SBA may be omitted, and the display driver 200 and the pads may be disposed in the non-display area NDA.

The display driver 200 may output signals and voltages for driving the display panel 100. The display driver 200 may supply data voltages to data lines. The display driver 200 may apply a supply voltage to a voltage line and may supply gate control signals to the gate driver. The display driver 200 may be implemented as an integrated circuit (IC) and may be attached on the display panel 100 by a chip-on-glass (COG) technique, a chip-on-plastic (COP) technique, or ultrasonic bonding. In an embodiment, for example, the display driver 200 may be disposed in the subsidiary area SBA and may overlap the main area MA in the thickness direction (or the third direction DR3) as the subsidiary area SBA is bent. In another embodiment, for example, the display driver 200 may be mounted on the circuit board 300.

The circuit board 300 may be attached on the pad area of the display panel 100 using an anisotropic conductive film (ACF). Lead lines of the circuit board 300 may be electrically connected to the pads of the display panel 100. The circuit board 300 may be a flexible printed circuit board (FPCB), a printed circuit board (PCB), or a flexible film such as a chip-on-film (COF).

The touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and may sense a change in the capacitance between the plurality of touch electrodes. In an embodiment, for example, the touch driving signals may be pulse signals having a predetermined frequency. The touch driver 400 may determine whether there is an input and may obtain the coordinates of the input based on the amount of the change in the capacitance between the touch electrodes. The touch driver 400 may be implemented as an integrated circuit (IC).

Figure 5:
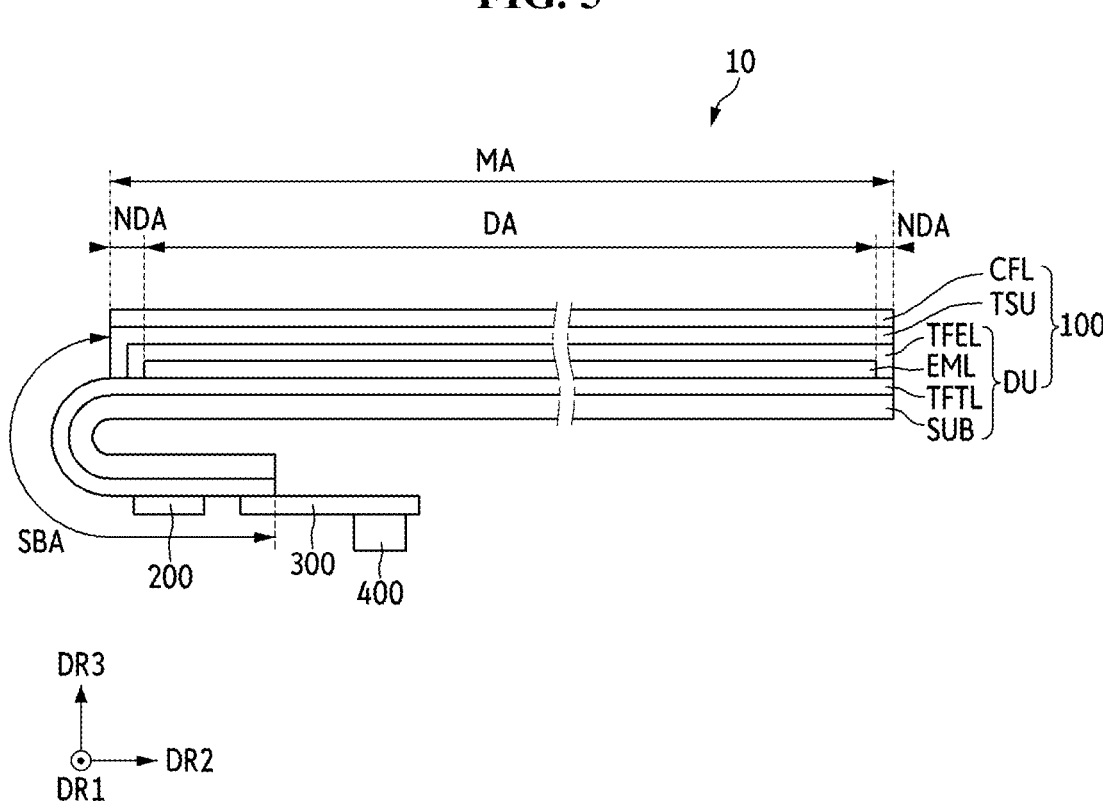
FIG. 5 is a cross-sectional view of the display device of FIG. 4.

FIG. 5 is a cross-sectional view of the display device of FIG. 4.

Referring to FIG. 5, an embodiment of the display panel 100 may include a display layer DU, a touch sensing layer TSU, and a color filter layer CFL. The display layer DU may include a substrate SUB, a thin-film transistor layer TFTL, an emission material layer EML and an encapsulation layer TFEL.

The substrate SUB may be a base substrate or a base member. The substrate SUB may be a flexible substrate that can be bent, folded, or rolled. In an embodiment, for example, the substrate SUB may include, but is not limited to, a polymer resin such as polyimide PI. According to another embodiment, the substrate SUB may include a glass material or a metal material.

The thin-film transistor layer TFTL may be disposed on the substrate SUB. The thin-film transistor layer TFTL may include a plurality of thin-film transistors forming pixel circuits of pixels. The thin-film transistor layer TFTL may include gate lines, data lines, voltage lines, gate control lines, fan-out lines for connecting the display driver 200 with the data lines, lead lines for connecting the display driver 200 with the pads, etc. Each of the thin-film transistors may include a semiconductor region, a source electrode, a drain electrode, and a gate electrode. In an embodiment, for example, when the gate driver is formed on one side of the non-display area NDA of the display panel 100, the gate driver may include thin-film transistors.

The thin-film transistor layer TFTL may be disposed in the display area DA, the non-display area NDA and the subsidiary area SBA. The thin-film transistors in each of the pixels, the gate lines, the data lines and the voltage lines in the thin-film transistor layer TFTL may be disposed in the display area DA. The gate control lines and the fan-out lines in the thin-film transistor layer TFTL may be disposed in the non-display area NDA. The lead lines of the thin-film transistor layer TFTL may be disposed in the subsidiary area SBA.

The emission material layer EML may be disposed on the thin-film transistor layer TFTL. The emission material layer EML may include a plurality of light-emitting elements each including a pixel electrode, a common electrode and an emissive layer to emit light, and a pixel-defining layer for defining the pixels. The plurality of light-emitting elements in the emission material layer EML may be disposed in the display area DA.

According to an embodiment of the disclosure, the emissive layer may be an organic emissive layer containing an organic material. The emissive layer may include a hole transporting layer, an organic light-emitting layer and an electron transporting layer. When the pixel electrode receives a voltage and the common electrode receives a cathode voltage through the thin-film transistors in the thin-film transistor layer TFTL, the holes and electrons may move to the organic light-emitting layer through the hole transporting layer and the electron transporting layer, respectively, such that they combine in the organic light-emitting layer to emit light.

According to another embodiment, the light-emitting elements may include quantum-dot light-emitting diodes each including a quantum-dot emissive layer, inorganic light-emitting diodes each including an inorganic semiconductor, or micro light-emitting diodes.

An encapsulation layer TFEL may cover the upper and side surfaces of the emission material layer EML, and can protect the emission material layer EML. The encapsulation layer TFEL may include at least one inorganic layer and at least one organic layer for encapsulating the emission material layer EML.

The touch sensing layer TSU may be disposed on the encapsulation layer TFEL. The touch sensing layer TSU may include a plurality of touch electrodes for sensing a user's touch by capacitive sensing, and touch lines connecting the plurality of touch electrodes with the touch driver 400. In an embodiment, for example, the touch sensing layer TSU may sense a user's touch by mutual capacitance sensing or self-capacitance sensing.

In another embodiment, for example, the touch sensing layer TSU may be disposed on a separate substrate disposed on the display layer DU. In such an embodiment, the substrate supporting the touch sensing layer TSU may be a base member encapsulating the display layer DU.

The plurality of touch electrodes of the touch sensing layer TSU may be disposed in a touch sensor area overlapping the display area DA. The touch lines of the touch sensing layer TSU may be disposed in a touch peripheral area overlapping the non-display area NDA.

The color filter layer CFL may be disposed on the touch sensing layer TSU. The color filter layer CFL may include a plurality of color filters associated with the plurality of emission areas, respectively. Each of the color filters may selectively transmit light of a particular wavelength and block or absorb lights of other wavelengths. The color filter layer CFL may absorb some of lights introduced from the outside of the display device 10 to reduce the reflection of external light. Accordingly, the color filter layer CFL can prevent distortion of colors due to the reflection of external light.

Since the color filter layer CFL is disposed directly on the touch sensing layer TSU, the display device 10 may not include any separate substrate for the color filter layer CFL. Therefore, the thickness of the display device 10 can be relatively small.

Figure 6:
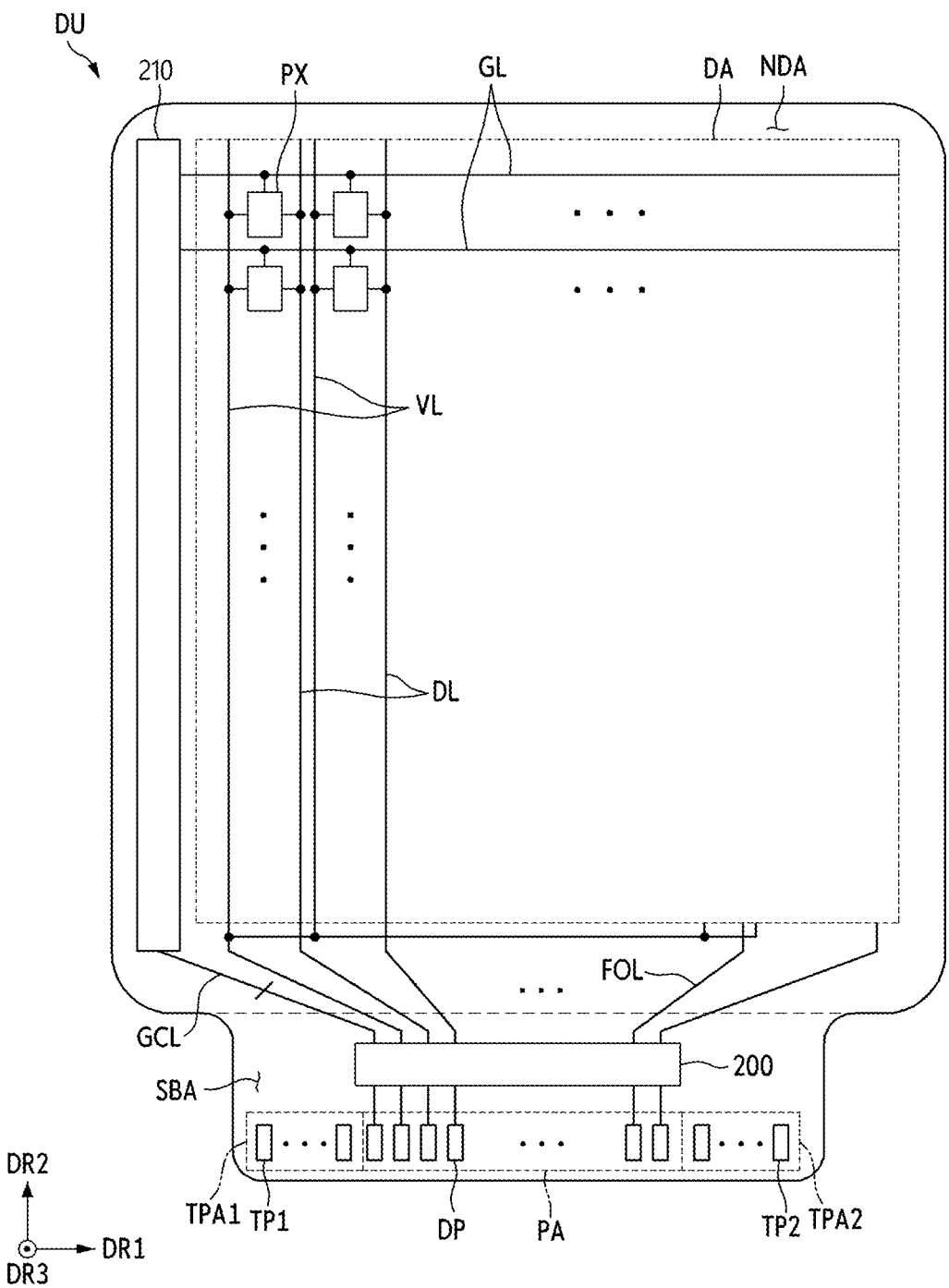
FIG. 6 is a plan view showing a display layer of a display device according to an embodiment of the disclosure.

FIG. 6 is a plan view showing a display layer of a display device according to an embodiment of the disclosure.

Referring to FIG. 6, an embodiment of the display layer DU may include a display area DA and a non-display area NDA.

The display area DA may be disposed or defined at the center of the display layer DU. In the display area DA, a plurality of pixels PX, a plurality of gate lines GL, a plurality of data lines DL and a plurality of voltage lines may be disposed. Each of the plurality of pixels PX may be defined as the minimum unit that outputs light.

The plurality of gate lines GL may supply the gate signals received from the gate driver 210 to the plurality of pixels PX. The plurality of gate lines GL may extend in the first direction DR1 and may be spaced apart from one another in the second direction DR2 intersecting the first direction DR1.

The plurality of data lines DL may supply the data voltages received from the display driver 200 to the plurality of pixels PX. The plurality of data lines DL may extend in the second direction DR2 and may be spaced apart from one another in the first direction DR1.

The plurality of voltage lines VL may apply the supply voltage received from the display driver 200 to the plurality of pixels PX. The supply voltage may be at least one selected from a driving voltage, an initialization voltage, a reference voltage and a low-level voltage. The plurality of voltage lines VL may extend in the second direction DR2 and may be spaced apart from one another in the first direction DR1.

The non-display area NDA may surround the display area DA. In the non-display area NDA, the gate driver 210, fan-out lines FOL, and gate control lines GCL may be disposed. The gate driver 210 may generate a plurality of gate signals based on the gate control signal, and may sequentially supply the plurality of gate signals to the plurality of gate lines GL in a predetermined order.

The fan-out lines FOL may extend from the display driver 200 to the display area DA. The fan-out lines FOL may supply the data voltage received from the display driver 200 to the plurality of data lines DL.

A gate control line GCL may extend from the display driver 200 to the gate driver 210. The gate control line GCL may supply the gate control signal received from the display driver 200 to the gate driver 210.

The subsidiary area SBA may include the display driver 200, a pad area DPA, and first and second touch pad areas TPA1 and TPA2.

The display driver 200 may output signals and voltages for driving the display panel 100 to the fan-out lines FOL. The display driver 200 may supply data voltages to the data lines DL through the fan-out lines FOL. The data voltages may be applied to the plurality of pixels PX, so that the luminance of the plurality of pixels PX may be controlled. The display driver 200 may supply a gate control signal to the gate driver 210 through the gate control lines GCL.

The pad area DPA, the first touch pad area TPA1 and the second touch pad area TPA2 may be disposed at the edge of the subsidiary area SBA. The pad area PA, the first touch pad area TPA1 and the second touch pad area TPA2 may be electrically connected to the circuit board 300 using a material such as an anisotropic conductive film and a self assembly anisotropic conductive paste (SAP). The first touch pad area TPA1 may include first touch pads TP1, the second touch pad area TPA2 may include second touch pads TP2, and they may be electrically connected to the circuit board 300.

The pad area PA may include a plurality of display pads DP. The plurality of display pads DP may be connected to a graphic system through the circuit board 300. The plurality of display pads DP may be connected to the circuit board 300 to receive digital video data and may supply the digital video data to the display driver 200.

Figure 7:
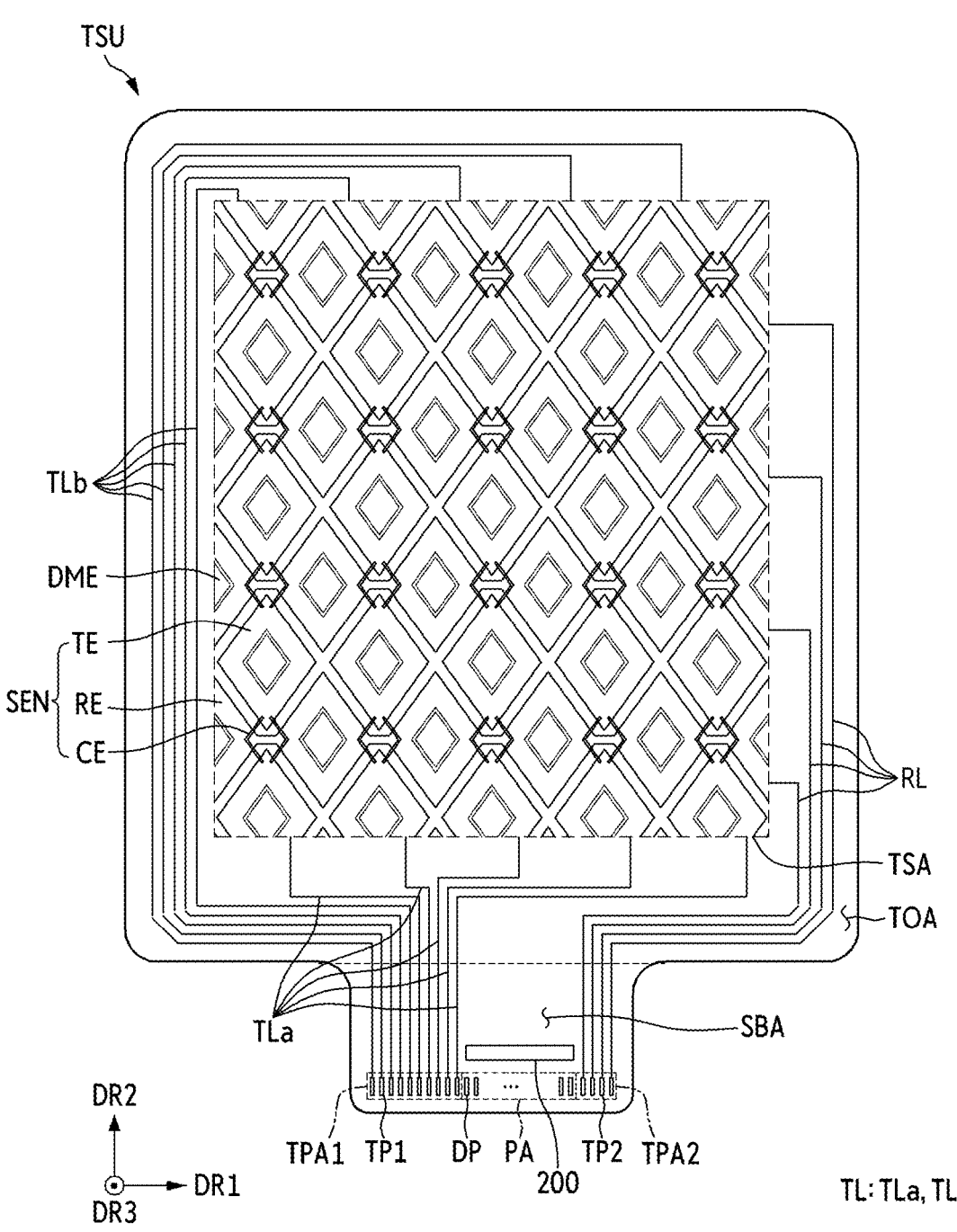
FIG. 7 is a plan view showing a touch sensing layer of a display device according to an embodiment of the disclosure.

FIG. 7 is a plan view showing a touch sensing layer of a display device according to an embodiment of the disclosure.

Referring to FIG. 7, an embodiment of the touch sensing layer TSU may include a touch sensor area TSA that senses a user's touch, and a touch peripheral area TOA disposed around the touch sensor area TSA. The touch sensor area TSA may be disposed in the display area DA of the display device 10, and the touch peripheral area TOA may be disposed in the non-display area NDA of the display device 10.

The touch sensor area TSA may include a plurality of touch electrodes SEN and a plurality of dummy electrodes DME. The plurality of touch electrodes SEN may form mutual capacitance or self capacitance to sense a touch of an object or person. The plurality of touch electrodes SEN may include a plurality of driving electrodes TE, a plurality of sensing electrodes RE, and bridge electrodes CE.

The driving electrodes TE may be arranged in the first direction DR1 and in the second direction DR2. The driving electrodes TE may be spaced apart from one another in the first direction DR1 and in the second direction DR2. The driving electrodes TE adjacent to one another in the second direction DR2 may be electrically connected through bridge electrodes CE.

The plurality of driving electrodes TE may be connected to the first touch pads TP1 through driving lines TL. The driving lines TL may include lower driving lines TLa and upper driving lines TLb. In an embodiment, for example, the driving electrodes TE disposed on the lower side of the touch sensor area TSA may be connected to the first touch pads TP1 through the lower driving lines TLa, and the driving electrodes TE disposed on the upper side of the touch sensor area TSA may be connected to the first touch pads TP1 through the upper driving lines TLb. The lower driving lines TLa may be extended to the first touch pads TP1 beyond the lower side of the touch peripheral area TOA. The upper driving lines TLb may be extended to the first touch pads TP1 via the upper side, the left side and the lower side of the touch peripheral area TOA. The first touch pads TP1 may be connected to the touch driver 400 through the circuit board 300.

The bridge electrodes CE may be bent at least once. Although the bridge electrodes CE may have the shape of angle brackets "<" or ">", the shape of the bridge electrodes CE in a plan view is not limited thereto. The driving electrodes TE adjacent to one another in the second direction DR2 may be connected by the plurality of bridge electrodes CE. Even in a case where one of the bridge electrodes CE is disconnected, the driving electrodes TE can be stably connected through the remaining bridge electrodes CE. The driving electrodes TE adjacent to each other may be connected by two bridge electrodes CE, but the number of bridge electrodes CE is not limited thereto.

The bridge electrodes CE may be disposed on a different layer from the plurality of driving electrodes TE and the plurality of sensing electrodes RE. The sensing electrodes RE adjacent to one another in the first direction DR1 may be electrically connected through connectors disposed in the same layer as the plurality of driving electrodes TE or the plurality of sensing electrodes RE. The driving electrodes TE adjacent to one another in the second direction DR2 may be electrically connected through the bridge electrodes CE disposed in a different layer from the plurality of driving electrodes TE or the plurality of sensing electrodes RE. Accordingly, even though the bridge electrodes CE overlap the plurality of sensing electrodes RE in the z-axis direction, the plurality of driving electrodes TE and the plurality of sensing electrodes RE can be insulated from each other. Mutual capacitance may be formed between the driving electrodes TE and the sensing electrodes RE.

The sensing electrodes TE may be extended in the first direction DR1 and may be spaced apart from one another in the second direction DR2. The sensing electrodes RE may be arranged in the first direction DR1 and the second direction DR2, and the sensing electrodes RE adjacent to one another in the first direction DR1 may be electrically connected through connectors.

The plurality of sensing electrodes RE may be connected to second touch pads TP2 through sensing lines RL. In an embodiment, for example, the sensing electrodes RE disposed on the right side of the touch sensor area TSA may be connected to the second touch pads TP2 through the sensing lines RL. The sensing lines RL may be extended to the second touch pads TP2 along the right side and the lower side of the touch peripheral area TOA. The second touch pads TP2 may be connected to the touch driver 400 through the circuit board 300.

Each of the plurality of dummy electrodes DME may be surrounded by the driving electrode TE or the sensing electrode RE. Each of the plurality of dummy electrodes DME may be spaced apart from and insulated from the driving electrode TE or the sensing electrode RE. Accordingly, the dummy electrodes DME may be electrically floating.

The pad area DPA, the first touch pad area TPA1 and the second touch pad area TPA2 may be disposed at the edge of the subsidiary area SBA. The pad area PA, the first touch pad area TPA1 and the second touch pad area TPA2 may be electrically connected to the circuit board 300 using a low-resistance, high-reliability material such as an anisotropic conductive film and a self assembly anisotropic conductive paste (SAP).

The first touch pad area TPA1 may be disposed on one side of the pad area PA and may include a plurality of first touch pads TP1. The plurality of first touch pads TP1 may be electrically connected to the touch driver 400 disposed on the circuit board 300. The plurality of first touch pads TP1 may supply touch driving signals to the plurality of driving electrodes TE through the plurality of driving lines TL.

The second touch pad area TPA2 may be disposed on the opposite side of the pad area PA and may include a plurality of second touch pads TP2. The plurality of second touch pads TP2 may be electrically connected to the touch driver 400 disposed on the circuit board 300. The touch driver 400 may receive a touch sensing signal through the plurality of sensing lines RL connected to the plurality of second touch pads TP2, and may sense a change in the capacitance between the driving electrodes TE and the sensing electrodes RE.

According to another embodiment, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense a change in the amount of charges in each of the plurality of driving electrodes TE and the plurality of sensing electrodes RE based on the touch sensing signal.

Although an embodiment having the structure where the plurality of touch electrodes SEN of the touch sensing layer TSU has the diamond shape and are connected in the first and second directions DR1 and DR2 is shown in FIG. 7 as an embodiment, the structure is not limited thereto. The plurality of touch electrodes SEN may be formed in a mesh topology.

Figure 8:
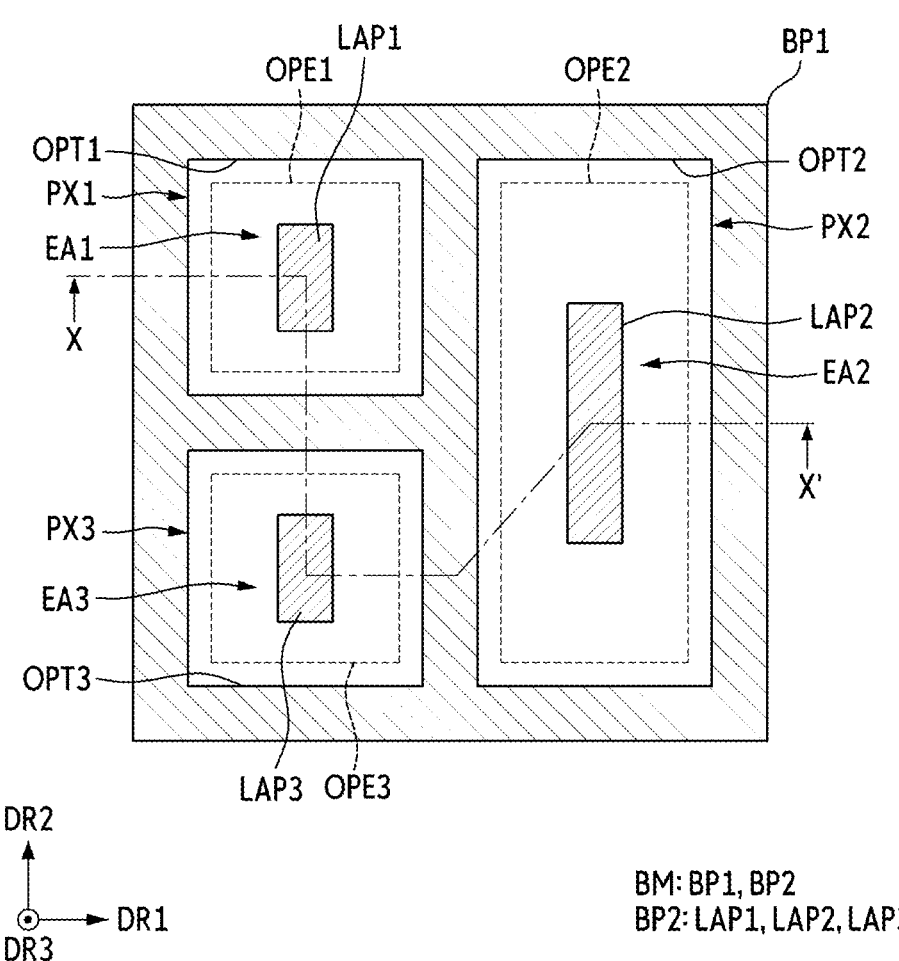
FIG. 8 is a plan view showing an example of emission areas of a display device according to an embodiment of the disclosure.
Figure 9:
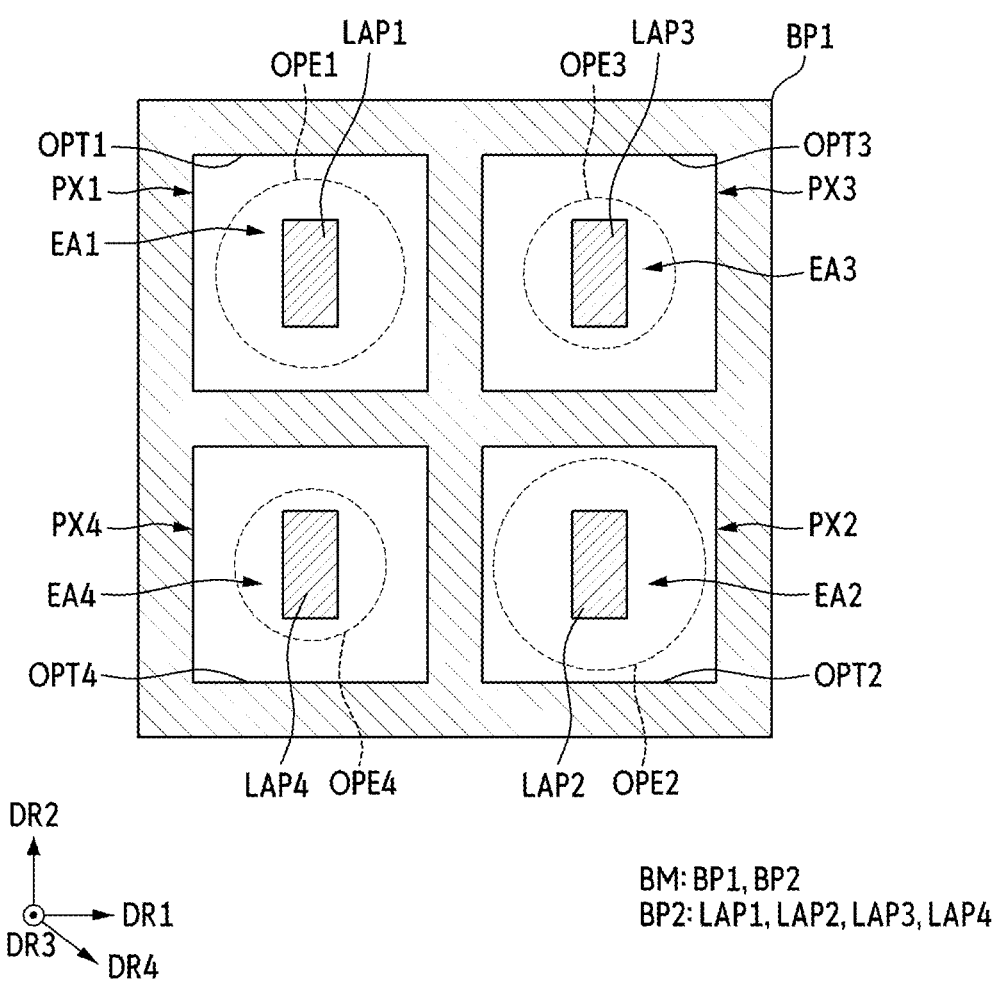
FIG. 9 is a plan view showing another example of emission areas of a display device according to an embodiment.

FIG. 8 is a plan view showing an example of emission areas of a display device according to an embodiment of the disclosure. FIG. 9 is a plan view showing another example of emission areas of a display device according to an embodiment. FIGS. 8 and 9 show light-blocking patterns BM.

Referring to FIG. 8, an embodiment of a display device 10 may include a plurality of pixels PX1, PX2 and PX3 arranged in a display area DA. The plurality of pixels PX1, PX2 and PX3 may be arranged repeatedly in the first direction D1 and the second direction D2. In an embodiment, for example, the second pixel PX2 may be disposed at a side of the first pixel PX1 in the first direction DR1, and the third pixel PX3 may be disposed at a side of the first pixel PX1 in the second direction DR2. In such an embodiment, second pixel may be disposed at a side of the third pixel PX3 in the first direction DR1.

The emission areas EA1, EA2 and EA3 of the pixels PX1, PX2 and PX3 may include a first emission area EA1, a second emission area EA2 and a third emission area EA3 that emit lights of different colors, respectively. Each of the first to third emission areas EA1, EA2 and EA3 may emit red, blue or green light. The colors of lights emitted from the emission areas EA1, EA2 and EA3 may vary depending on the type of light-emitting elements ED (see FIG. 10) disposed in the emission material layer EML to be described later. According to an embodiment of the disclosure, the first emission area EA1 emits first light of red color, the second emission area EA2 emits second light of blue color, and the third emission area EA3 emits third light of green color. It is, however, to be understood that the disclosure is not limited thereto.

The first to third emission areas EA1, EA2 and EA3 may be defined by a plurality of openings OPE1, OPE2 and OPE3 formed in a pixel-defining layer PDL (see FIG. 10) of the emission material layer EML, which will be described later. In an embodiment, for example, the first emission area EA1 may be defined by the first opening OPE1 of the pixel-defining layer, the second emission area EA2 may be defined by the second opening OPE2 of the pixel-defining layer, and the third emission area EA3 may be defined by the third opening OPE3 of the pixel-defining layer.

According to an embodiment of the disclosure, at least two of the first to third emission areas EA1, EA2 and EA3 may have a same area (or planar area) or size as each other, or at least one of the first to third emission areas EA1, EA2 and EA3 may have different areas or sizes from another thereof. In an embodiment, as shown in FIG. 8, the area of the first emission area EA1 may be equal to the area of the third emission area EA3. In such an embodiment, the area of the second emission area EA2 may be greater than the areas of the first emission area EA1 and the third emission area EA3. The areas or sizes of the emission areas EA1, EA2 and EA3 may vary depending on the sizes (e.g., planar areas) of the opening OPE1, OPE2 and OPE3 formed in the pixel-defining layer. The intensity of lights emitted from the emission areas EA1, EA2 and EA3 may vary depending on the size of the emission areas EA1, EA2 and EA3. The colors of the images displayed on the display device 10 or the electronic device 1 may be controlled by adjusting the size of the emission areas EA1, EA2 and EA3.

Although the first emission area EA1 and the third emission area EA3 may have a same size according to the embodiment of FIG. 8, the disclosure is not limited thereto. In some embodiments, the first emission area EA1 may be greater than the third emission area EA3. The size of the emission areas EA1, EA2 and EA3 may be adjusted as desired according to the colors of the images used by the display device 10 and the electronic device 1. In addition, the sizes of the emission areas EA1, EA2 and EA3 may be related to light efficiency, lifespan of the light-emitting elements ED, etc., and may have a trade-off relationship with reflection of external light. The sizes of the emission areas EA1, EA2 and EA3 may be adjusted by taking the above factors into account.

In an embodiment, as shown in FIG. 8, the plurality of openings OPE1, OPE2 and OPE3 and the plurality of output areas OPT1, OPT2 and OPT3 may have a rectangular shape, but the disclosure is not limited thereto. In another embodiment, the plurality of openings OPE1, OPE2 and OPE3 and the plurality of output areas OPT1, OPT2 and OPT3 may have a variety of shapes, such as an oval shape and a polygonal shape with rounded edges.

Each of the plurality of pixels PX1, PX2 and PX3 may include first to third emission areas EA1, EA2 and EA3 arranged adjacent to each other, and may represent black-and-white or grayscale images. It should be understood, however, that the disclosure is not limited thereto. The combination of the emission areas EA1, EA2, and EA3 forming a single pixel group may be modified depending on the arrangement of the emission areas EA1, EA2 and EA3, and the colors of the lights emitted from them.

The display device 10 may include a light-blocking pattern BM that defines a plurality of output areas OPT1, OPT2 and OPT3. The light-blocking pattern BM may absorb light from an outside and incident thereto to reduce the reflectance of external light. The light-blocking pattern BM may not overlap the emission areas EA1, EA2 and EA3. In an embodiment, for example, the areas of the plurality of output areas OPT1, OPT2 and OPT3 defined by the light-blocking pattern BM may be larger than the areas of the emission areas EA1, EA2, and EA3. The output areas OPT1, OPT2 and OPT3 may overlap the openings OPE1, OPE2 and OPE3, respectively, and may form light exit areas through which lights output from the emission areas EA1, EA2 and EA3 exit.

The light-blocking pattern BM may include a first pattern BP1 and a second pattern BP2. The first pattern BP1 may be arranged in a mesh or grid pattern to define a plurality of output areas OPT1, OPT2 and OPT3. The second pattern BP2 may be disposed in the plurality of openings OPE1, OPE2 and OPE3 and may overlap the emission areas EA1, EA2 and EA3. The second pattern BP2 may be spaced apart from the first pattern BP1 and may be surrounded by the first pattern BP1.

The second pattern BP2 may include a first sub-pattern LAP1, a second sub-pattern LAP2, and a third sub-pattern LAP3. The first sub-pattern LAP1 may be disposed in the first output area OPT1 and overlap the first emission area EA1 in the third direction DR3. The second sub-pattern LAP2 may be disposed in the second output area OPT2 and overlap the second emission area EA2 in the third direction DR3. The third sub-pattern LAP3 may be disposed in the third output area OPT3 and overlap the third emission area EA3 in the third direction DR3.

The first to third sub-patterns LAP1, LAP2 and LAP3 may have shapes similar to the shapes of the openings OPE1, OPE2 and OPE3. In an embodiment, for example, the first to third sub-patterns LAP1, LAP2 and LAP3 may have, but is not limited to, rectangular shapes. The light-blocking pattern BM will be described in greater detail later.

Referring to FIG. 9, in an embodiment, the plurality of pixels may further include a fourth pixel PX4. In such an embodiment, a single pixel group may include a first pixel PX1, a second pixel PX2, a third pixel PX3, and a fourth pixel PX4. The plurality of pixels PX1, PX2 and PX3 may be arranged repeatedly in the first direction D1 and the second direction D2. In an embodiment, for example, the second pixel PX2 may be disposed at a side of the first pixel PX1 in a fourth direction DR4, which is perpendicular to the third direction DR3 and crossing the first and second directions DR1 and DR2, the third pixel PX3 may be disposed at a side of the first pixel PX1 in the first direction DR1, and a fourth pixel PX4 may be disposed at a side of the first pixel PX1 in the second direction DR2.

The fourth pixel PX4 may include a fourth emission area EA4. The fourth emission area EA4 may be defined by the openings OPE4 formed in the pixel-defining layer PDL (see FIG. 10) of the emission material layer EML, which will be described later. In such an embodiment, the third emission area EA3 and the fourth emission area EA4 may emit lights of a same color. In an embodiment, for example, the third emission area EA3 and the fourth emission area EA4 may emit green third light. The area of the fourth emission area EA4 may be equal to that of the third emission area EA3.

The second pattern BP2 of the light-blocking pattern BM may further include a fourth sub-pattern LAP4. The fourth sub-pattern LAP4 may be disposed in the fourth output area OPT4 and overlap the fourth emission area EA4. The fourth sub-pattern LAP4 may have a shape similar to that of the fourth opening OPE4. In an embodiment, for example, the fourth sub-pattern LAP4 may have, but is not limited to, a rectangular shape.

Figure 10:
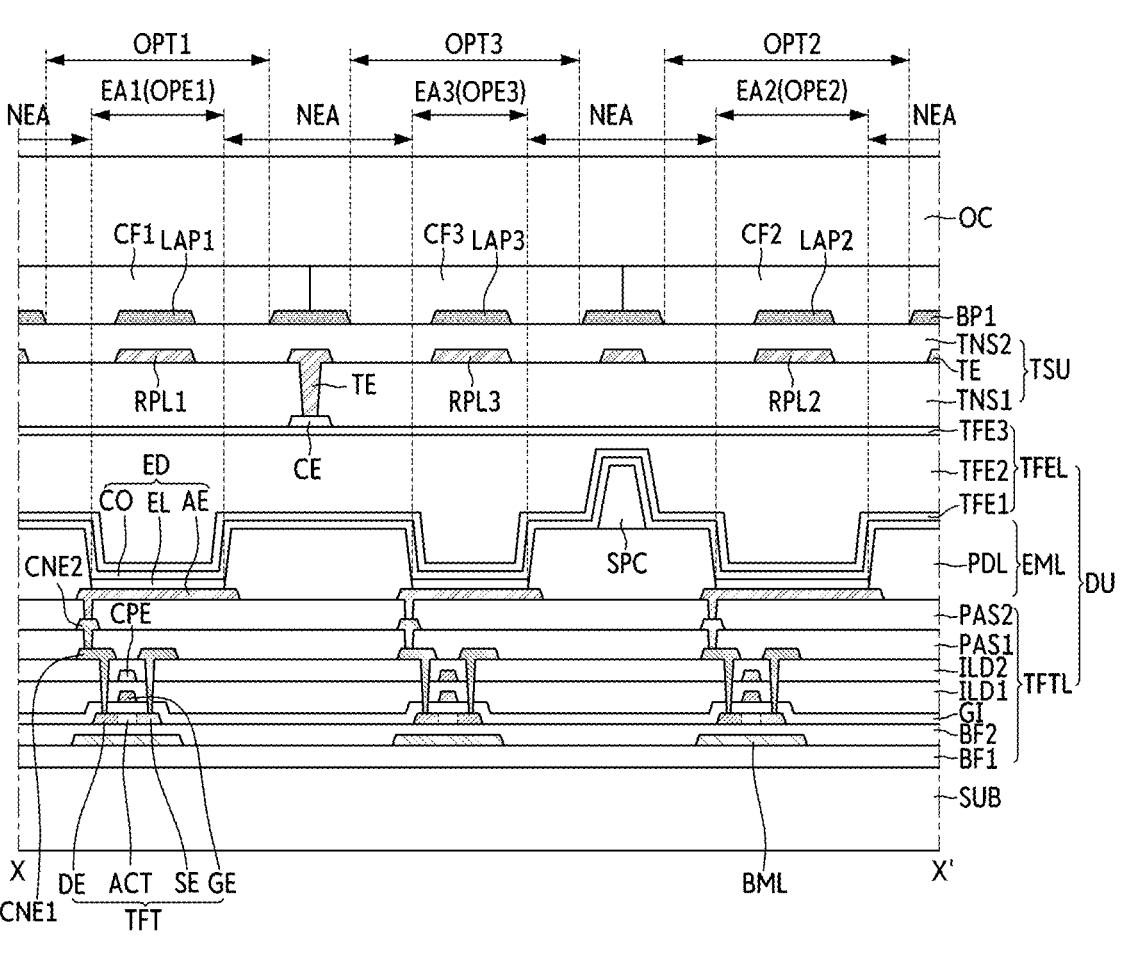
FIG. 10 is a cross-sectional view taken along line X-X' of FIG. 8.
Figure 11:
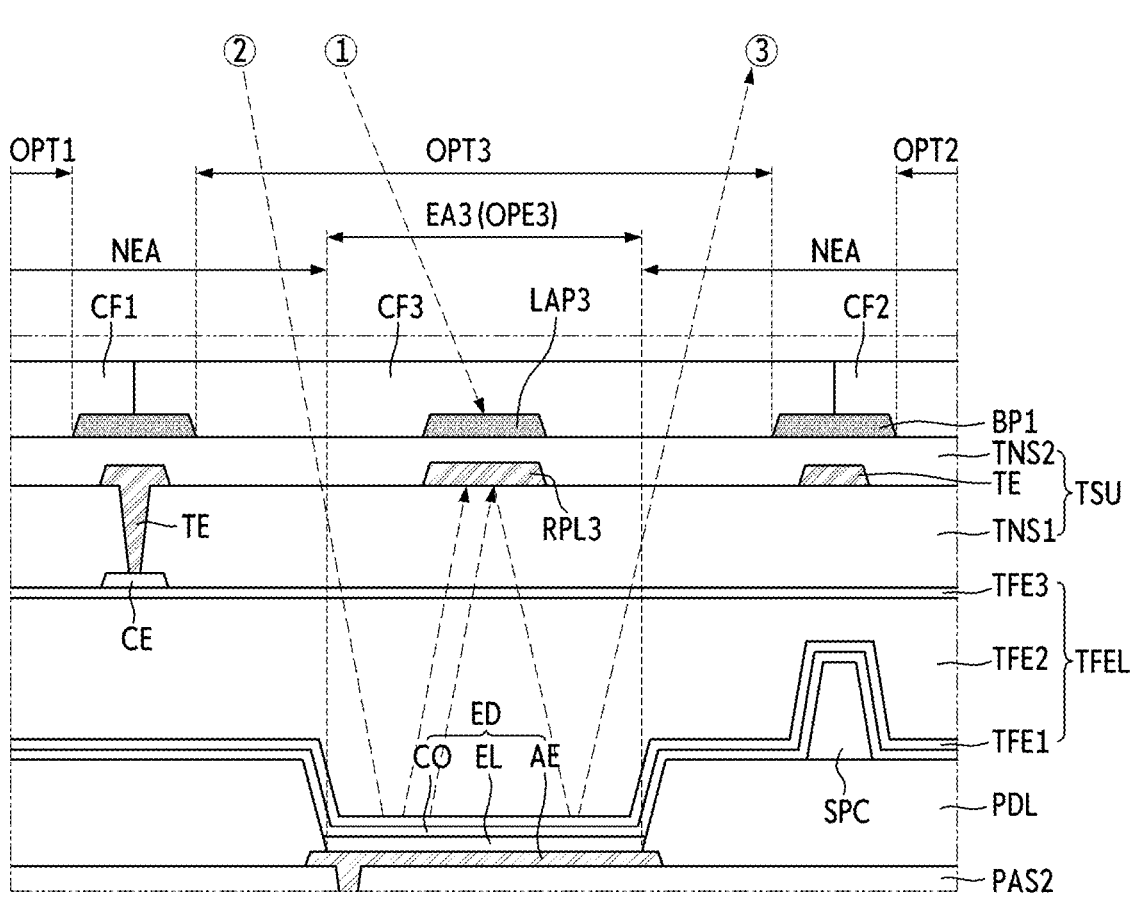
FIG. 11 is an enlarged, cross-sectional view showing a third emission area of a display device according to an embodiment.
Figure 11:
Figure 12:
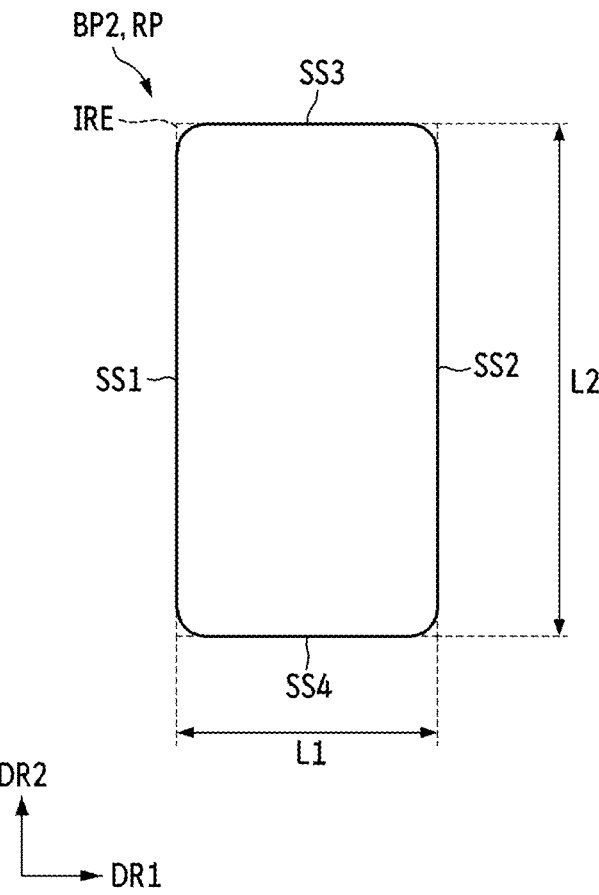
FIG. 12 is a plan view showing an example of a second pattern and a reflective pattern according to an embodiment.
Figure 13:
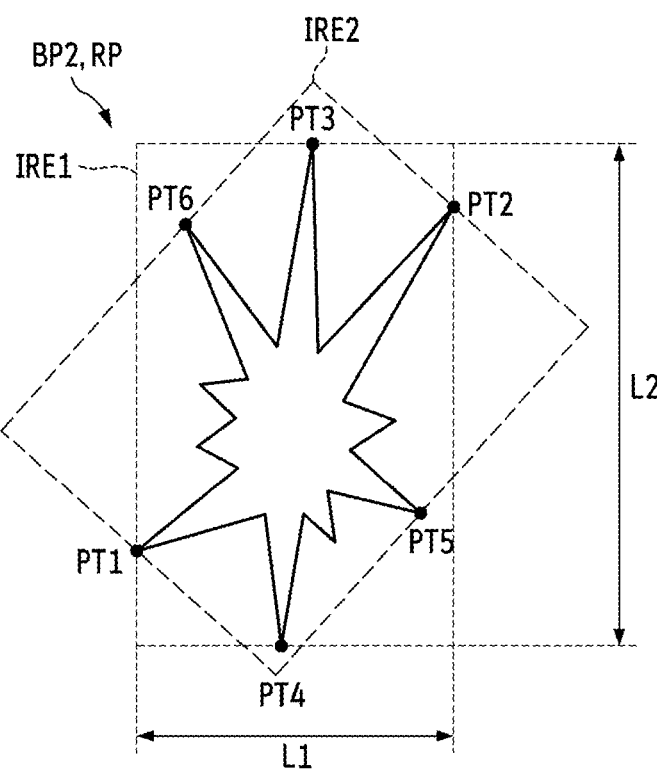
FIG. 13 is a plan view showing another example of a second pattern and a reflective pattern according to an embodiment.
Figure 13:
Figure 14:
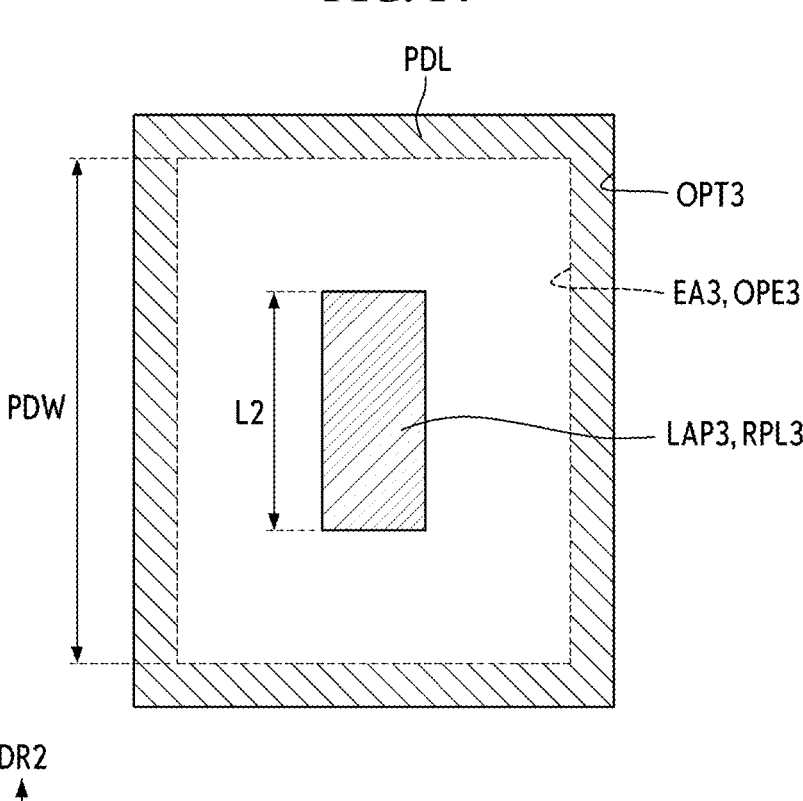
FIG. 14 is a plan view showing a third emission area, a third sub-pattern, and a third reflective layer according to an embodiment.

FIG. 10 is a cross-sectional view taken along line X-X' of FIG. 8. FIG. 11 is an enlarged, cross-sectional view showing a third emission area of a display device according to an embodiment. FIG. 12 is a plan view showing an example of a second pattern and a reflective pattern according to an embodiment. FIG. 13 is a plan view showing another example of a second pattern and a reflective pattern according to an embodiment. FIG. 14 is a plan view showing a third emission area, a third sub-pattern, and a third reflective layer according to an embodiment.

Referring to FIGS. 10 and 11 in conjunction with FIGS. 8 and 9, the display panel 100 of the display device 10 according to an embodiment may include a display layer DU, a touch sensing layer TSU, a color filter layer CFL and an overcoat layer OC. The display layer DU may include a substrate SUB, a thin-film transistor layer TFTL, an emission material layer EML and an encapsulation layer TFEL.

The substrate SUB may be a base substrate or a base member. The substrate SUB may be a flexible substrate that can be bent, folded, or rolled. In an embodiment, for example, the substrate SUB may include, but is not limited to, a polymer resin such as polyimide (PI). In another embodiment, for example, the substrate SUB may include a glass material or a metal material.

The thin-film transistor layer TFTL may include a first buffer layer BF1, a bottom metal layer BML, a second buffer layer BF2, a thin-film transistor TFT, a gate insulator GI, a first interlayer dielectric layer ILD1, a capacitor electrode CPE, a second interlayer dielectric layer ILD2, a first connection electrode CNE1, a first passivation layer PAS1, a second connection electrode CNE2 and a second passivation layer PAS2.

The first buffer layer BF1 may be disposed on the substrate SUB. The first buffer layer BF1 may include an inorganic film capable of preventing permeation of air or moisture. In an embodiment, for example, the first buffer layer BF1 may include a plurality of inorganic films stacked on one another alternately.

The bottom metal layer BML may be disposed on the first buffer layer BF1. In an embodiment, for example, the bottom metal layer BML may be made up of (or defined by) a single layer or multiple layers, each layer including at least one selected from molybdenum (Mo), aluminum (Al), chromium (Cr), gold (Au), titanium (Ti), nickel (Ni), neodymium (Nd), Tantalum (Ta) and copper (Cu) or an alloy thereof.

The second buffer layer BF2 may cover the first buffer layer BF1 and the bottom metal layer BML. The second buffer layer BF2 may include an inorganic film capable of preventing permeation of air or moisture. In an embodiment, for example, the second buffer layer BF2 may include a plurality of inorganic films stacked on one another alternately.

The thin-film transistor TFT may be disposed on the second buffer layer BF2 and may form a pixel circuit of each of a plurality of pixels. In an embodiment, for example, the thin-film transistor TFT may be a driving transistor or a switching transistor of the pixel circuit. The thin-film transistor TFT may include a semiconductor layer ACT, a source electrode SE, a drain electrode DE and a gate electrode GE.

The semiconductor layer ACT may be disposed on the second buffer layer BF2. The semiconductor layer ACT may overlap the bottom metal layer BML and the gate electrode GE in a thickness direction of the substrate SUB (or the third direction DR3) and may be insulated from the gate electrode GE by the gate insulator GI. The material of a portion of the semiconductor layer ACT may be made conductive (e.g., doped) to form the source electrode SE and the drain electrode DE.

The gate electrode GE may be disposed on the gate insulator GI. The gate electrode GE may overlap the semiconductor layer ACT in the thickness direction with the gate insulating layer GI interposed therebetween.

The gate insulator GI may be disposed on the semiconductor layer ACT. In an embodiment, for example, the gate insulator GI may cover the semiconductor layer ACT and the second buffer layer BF2, and may insulate the semiconductor layer ACT from the gate electrode GE. The gate insulator GI may be provided with a contact hole through which the first connection electrode CNE1 passes.

The first interlayer dielectric layer ILD1 may cover the gate electrode GE and the gate insulator GI. The first interlayer dielectric layer ILD1 may be provided with a contact hole through which the first connection electrode CNE1 passes. The contact holes of the first interlayer dielectric layer ILD1 may be connected to the contact holes of the gate insulator GI and the contact holes of the second interlayer dielectric layer ILD2.

The capacitor electrode CPE may be disposed on the first interlayer dielectric layer ILD1. The capacitor electrode CPE may overlap the gate electrode GE in the thickness direction. The capacitor electrode CPE and the gate electrode GE may form a capacitance.

The second interlayer dielectric layer ILD2 may cover the capacitor electrode CPE and the first interlayer dielectric layer ILD1. The second interlayer dielectric layer ILD2 may be provided with a contact hole through which the first connection electrode CNE1 passes. The contact hole of the second interlayer dielectric layer ILD2 may be connected to the contact hole of the first interlayer dielectric layer ILD1 and the contact hole of the gate insulator GI.

The first connection electrode CNE1 may be disposed on the second interlayer dielectric layer ILD2. The first connection electrode CNE1 may electrically connect the drain electrode DE of the thin-film transistor TFT with the second connection electrode CNE2. The first connection electrode CNE1 may be inserted into a contact hole formed in the second interlayer dielectric layer ILD2, the first interlayer dielectric layer ILD1, and the gate insulator GI to be in contact with the drain electrode DE of the thin-film transistor TFT.

A first passivation layer PAS1 may cover the first connection electrode CNE1 and the second interlayer dielectric layer ILD2. The first passivation layer PAS1 can protect the thin-film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 with a pixel electrode AE of the light-emitting element ED. The second connection electrode CNE2 may be inserted into a contact hole formed in the first passivation layer PAS1 to be in contact with the first connection electrode CNE1.

The second passivation layer PAS2 may cover the second connection electrode CNE2 and the first passivation layer PAS1. The second passivation PAS2 may include a contact hole through which the pixel electrode AE of the light-emitting diode ED passes.

The emission material layer EML may be disposed on the thin-film transistor layer TFTL. The emission material layer EML may include a light-emitting element ED and a pixel-defining layer PDL. The light-emitting diode ED may include the anode electrode AE, an emissive layer EL, and a common electrode CO.

The pixel electrode AE may be disposed on the second passivation layer PAS2. The pixel electrode AE may be disposed to correspond to one of openings OPE1, OPE2 and OPE3 of the pixel-defining layer PDL. The pixel electrode AE may be electrically connected to the drain electrode DE of the thin-film transistor TFT through the first and second connection electrodes CNE1 and CNE2.

The emissive layer EL may be disposed on the pixel electrode AE. For example, the emissive layer EL may be, but is not limited to, an organic emissive layer made of an organic material. In an embodiment where the emissive layer EL is an organic emissive layer, when the thin-film transistor applies a predetermined voltage to the pixel electrode AE of the light-emitting diode ED and the common electrode CO of the light-emitting diode ED receives a common voltage or cathode voltage, the holes and electrons may move to the emissive layer EL through the hole transporting layer and the electron transporting layer, respectively, and the holes and electrons combine in the emissive layer EL to emit light.

The common electrode CO may be disposed on the emissive layer EL. In an embodiment, for example, the common electrode CO may be implemented as an electrode common to all pixels, instead of being disposed as a separated electrode for each of the pixels. The common electrode CO may be disposed on the emissive layer EL in the first to third emission areas EA1, EA2 and EA3, and may be disposed on the pixel-defining layer PDL, which is disposed in the other areas than the first to third emission areas EA1, EA2 and EA3.

The common electrode CO may receive a common voltage or a low-level voltage. When the pixel electrode AE receives the voltage equal to the data voltage and the common electrode CO receives the low-level voltage, a potential difference is formed between the pixel electrode AE and the common electrode CO, so that the emissive layer EL can emit light.

The pixel-defining layer PDL may define or be provided with a plurality of openings OPE1, OPE2 and OPE3, and may be disposed on the second passivation layer PAS2 and a portion of the pixel electrode AE. in an embodiment, a first opening OPE1, a second opening OPE2 and a third opening OPE3 may be defined or formed through the pixel-defining layer PDL, and each of the openings OPE1, OPE2 and OPE3 is a portion in which the pixel electrode AE is disposed. As described above, the openings OPE1, OPE2 and OPE3 of the pixel-defining layer PDL may define the first to third emission areas EA1, EA2 and EA3, respectively, and a non-emission area NEA. The openings OPE1, OPE2 and OPE3 of the pixel-defining layer PDL may have different areas or sizes. The pixel-defining layer PDL may separate and insulate the pixel electrode AE of one of the plurality of light-emitting diodes ED from the pixel electrode of another one of the light-emitting diodes ED.

The pixel-defining layer PDL may include a light-absorbing material to prevent light reflection. In an embodiment, for example, the pixel-defining layer PDL may include a polyimide (PI)-based binder, and pigments in which red, green and blue are mixed. Alternatively, the pixel-defining layer PDL may include a cardo-based binder resin and a mixture of lactam black pigment and blue pigment. Alternatively, the pixel-defining layer PDL may include carbon black.

A spacer SPC may be disposed on the pixel-defining layer PDL. The spacer SPC can prevent underlying layers from being damaged by a contact with a mask during a deposition process of the emissive layer EL. The spacer SPC may be disposed directly on the pixel-defining layer PDL and may correspond to the non-emission area NEA. The spacer SPC may include an organic material and may have a thickness of about 1 micrometer (μm) or greater.

The encapsulation layer TFEL may be disposed on the common electrode CO to cover the light-emitting diodes ED. The encapsulation layer TFEL may include at least one inorganic layer to prevent permeation of oxygen or moisture into the emission material layer EML. The encapsulation layer TFEL may include at least one organic layer to protect the emission material layer EML from foreign substances such as dust.

The encapsulation layer TFEL may include a first encapsulation layer TFE1, a second encapsulation layer TFE2 and a third encapsulation layer TFE3. The first encapsulation layer TFE1 and the third encapsulation layer TFE3 may be inorganic encapsulation layers, and the second encapsulation layer TFE2 disposed therebetween may be an organic encapsulation layer.

Each of the first encapsulation layer TFE1 and the third encapsulation layer TFE3 may include one or more inorganic insulating materials. The inorganic insulating material may include aluminum oxide, titanium oxide, tantalum oxide, hafnium oxide, zinc oxide, silicon oxide, silicon nitride, and/or silicon oxynitride.

The second encapsulation layer TFE2 may include an organic insulating material. Organic insulating materials may include an acrylic resin, an epoxy resin, polyimide, and/or polyethylene, for example. The second encapsulation layer TFE2 may be formed by curing a monomer or by applying a polymer.

The touch sensing layer TSU may be disposed on the encapsulation layer TFEL. The touch sensing layer TSU may include a first touch insulating layer TNS1, a second touch insulating layer TNS2, driving electrodes TE, bridge electrodes CE, and a reflective pattern RP. Although not shown in the drawings, the touch sensing layer TSU may further include the sensing electrodes RE shown in FIG. 7.

The bridge electrodes CE may be disposed on the third encapsulation layer TFE3. The bridge electrodes CE may be disposed in the non-emission area NEA. In an embodiment, for example, the bridge electrodes CE may overlap the non-emission area NEA in the thickness direction. The bridge electrodes CE may not overlap the first to third emission areas EA1, EA2 and EA3 in the thickness direction.

The first touch insulating layer TNS1 may be disposed on the bridge electrode CE and the third encapsulation layer TFE3. The first touch insulating layer TNS1 may include an organic film or an inorganic film. In an embodiment, for example, the first touch insulating layer TNS1 may include an organic film such as an acrylic resin, an epoxy resin, polyimide and polyethylene, or may include an inorganic film such as silicon nitride, silicon oxide and silicon nitride.

The driving electrodes TE may be disposed directly on the first touch insulating layer TNS1. The driving electrodes TE may be disposed in the non-emission area EA. In an embodiment, for example, the driving electrodes TE may overlap the non-emission area EA in the thickness direction. The driving electrodes TE may not overlap with the first to third emission areas EA1, EA2 and EA3. The driving electrodes TE may be connected to the bridge electrodes CE through contact holes defined or formed through the first touch insulating film TINS1. Although not shown in the drawings, the driving electrodes TE and the sensing electrodes RE (see FIG. 7) may be disposed on the first touch insulating layer TINS1.

The driving electrodes TE may be made up of (or defined by) a single layer including at least one selected from molybdenum (Mo), titanium (Ti), copper (Cu), aluminum (Al), or indium tin oxide (ITO), or may be made up of a stack structure of aluminum and titanium (Ti/Al/Ti), a stack structure of aluminum and ITO (ITO/Al/ITO), an APC (Ag—Pd—Cu) alloy and a stack structure of an APC alloy and ITO (ITO/APC/ITO).

The second touch insulating layer TNS2 may be disposed on the driving electrodes TE and the first touch insulating layer TNS1. The second touch insulating layer TNS2 may cover the driving electrodes TE and the first touch insulating layer TNS1 to provide a flat surface over the underlying elements. The second touch insulating layer TNS2 may include at least one selected from the above-listed materials for the first touch insulating layer TNS1.

The reflective pattern RP may be disposed between the first touch insulating layer TNS1 and the second touch insulating layer TNS2. In an embodiment, for example, the reflective pattern RP may be disposed on the first touch insulating layer TNS1 and covered by the second touch insulating layer TNS2. The reflective pattern RP may be disposed on the same layer as the driving electrodes TE. The reflective pattern RP may be spaced apart from the driving electrodes TE, the sensing electrode RE (see FIG. 7), and the bridge electrodes CE. The reflective pattern RP may overlap with the openings OPE1, OPE2 and OPE3 of the pixel-defining layer PDL, respectively. In an embodiment, for example, the reflective pattern RP may be disposed in the central area of the respective emission areas EA1, EA2 and EA3.

The reflective pattern RP may include a first reflective layer RPL1, a second reflective layer RPL2, and a third reflective layer RPL3. The first reflective layer RPL1 may overlap with the first emission area EA1 but not with the non-emission area NEA. The second reflective layer RPL2 may overlap the second emission area EA2 in the thickness direction, but not overlap the non-emission area NEA in the thickness direction. The third reflective layer RPL3 may overlap the third emission area EA3 in the thickness direction but not overlap the non-emission area NEA in the thickness direction.

The reflective pattern RP may overlap the second pattern BP2 of the light-blocking pattern BM, which will be described later, in the thickness direction. In an embodiment, for example, the first reflective layer RPL1 may overlap the first sub-pattern LAP1 in the thickness direction, the second reflective layer RPL2 may overlap the second sub-pattern LAP2 in the thickness direction, and the third reflective layer RPL3 may overlap the third sub-pattern LAP3 in the thickness direction.

According to an embodiment of the disclosure, the width of the reflective pattern RP in a direction may be equal to a width in the direction of the second pattern BP2 of the light-blocking pattern BM corresponding thereto. In an embodiment, for example, the width of the reflective pattern RP in the first direction DR1 may be equal to the width of the second pattern BP2 of the light-blocking pattern BM in the first direction DR1. In an embodiment, for example, the width of the first reflective layer RPL1 may be equal to the width of the first sub-pattern LAP1, the width of the second reflective layer RPL2 may be equal to the width of the second sub-pattern LAP2, and the width of the third reflective layer RPL3 may be equal to the width of the third sub-pattern LAP3.

In a plan view (or when viewed in the third direction DR3), the shape of the reflective pattern RP may be identical to the shape of the respective second pattern BP2 of the light-blocking pattern BM in the thickness direction. In an embodiment, for example, in a plan view, the shape of the first reflective layer RPL1 may be identical to the shape of the first sub-pattern LAP1, the shape of the second reflective layer RPL2 may be identical to the shape of the second sub-pattern LAP2, and The shape of the third reflective layer RPL3 may be identical to the shape of the third sub-pattern LAP3.

The area of the reflective pattern RP may be equal to the area of the respective second pattern BP2 of the light-blocking pattern BM overlapping in the thickness direction. In an embodiment, for example, the area of the first reflective layer RPL1 may be equal to the area of the first sub-pattern LAP1, the area of the second reflective layer RPL2 may be equal to the area of the second sub-pattern LAP2, and the area of the third reflective layer RPL3 may be equal to the area of the third sub-pattern LAP3.

The reflective pattern RP may have a variety of shapes, such as a circle, an oval, a triangle, and other more polygons. It should be understood, however, that the embodiments of the disclosure are not limited thereto.

The reflective pattern RP may be made up of a single layer or multiple layers. In an embodiment where the reflective pattern RP is made up of multiple layers, the layers including different metals may be stacked on one another. The reflective pattern RP may include a same material as the driving electrodes TE. The reflective pattern RP may include molybdenum (Mo), titanium (Ti), copper (Cu), and/or aluminum (Al), for example. The reflective pattern RP made up of multiple layers may include a two-layer structure such as titanium/aluminum, aluminum/molybdenum, and titanium/copper. It should be understood, however, that the embodiments of the disclosure are not limited thereto. The reflective pattern RP may include at least one selected from the above-listed materials for the driving electrodes TE.

The color filter layer CFL may be disposed on the touch sensing layer TSU. The color filter layer CFL may be a reflection control layer that controls reflection of external light. The color filter layer CFL may include a plurality of color filters CF1, CF2 and CF3 and the light-blocking pattern BM. Each of the color filters CF1, CF2 and CF3 may selectively transmit light of a particular wavelength and block or absorb lights of other wavelengths. The color filter layer CFL may absorb some of lights introduced from the outside of the display device 10 to reduce the reflection of external light. Accordingly, the color filter layer CFL may effectively prevent distortion of colors due to the reflection of external light.

The light-blocking pattern BM may be disposed on the second touch insulating layer TNS2 of the touch sensing layer TSU. The light-blocking pattern BM may include a first pattern BP1 and a second pattern BP2.

The first pattern BP1 may be arranged in a mesh pattern to define a plurality of output areas OPT1, OPT2 and OPT3. The first pattern BP1 may cover the conductive line of the driving electrodes TE, and may define the plurality of output areas OPT1, OPT2 and OPT3 overlapping the first to third emission areas EA1, EA2 and EA3 in the thickness direction. In an embodiment, for example, the first output area OPT1 may overlap the first emission area EA1 or the first opening OPE1 in the thickness direction. The second output area OPT2 may overlap the second emission area EA2 or the second opening OPE2 in the thickness direction, and the third output area OPT3 may overlap the third emission area EA3 or the third opening OPE3 in the thickness direction. The first pattern BP1 may not overlap the plurality of emission areas EA1, EA2 and EA3 in the thickness direction, and may overlap the non-emission area NEA.

In an embodiment, the areas or sizes of the output areas OPT1, OPT2 and OPT3 may be larger than the areas or sizes of the openings OPE1, OPE2 and OPE3 of the pixel-defining layer PDL. In such an embodiment, as the output areas OPT1, OPT2 and OPT3 of the light-blocking layer BM are larger than the openings OPE1, OPE2 and OPE3 of the pixel-defining layer PDL, the lights output from the emission areas EA1, EA2 and EA3 may be seen by a user not only from the front but also from the sides of the display device 10.

The second pattern BP2 may be disposed in the plurality of openings OPE1, OPE2 and OPE3 in a plan view and may overlap the emission areas EA1, EA2 and EA3. The second pattern BP2 may be spaced apart from the first pattern BP1 and may be surrounded by the first pattern BP1.

The second pattern BP2 may include a first sub-pattern LAP1, a second sub-pattern LAP2, and a third sub-pattern LAP3. The first sub-pattern LAP1 may be disposed in the first output area OPT1 and overlap the first emission area EA1 in the thickness direction. The second sub-pattern LAP2 may be disposed in the second output area OPT2 and overlap the second emission area EA2 in the thickness direction. The third sub-pattern LAP3 may be disposed in the third output area OPT3 and overlap the third emission area EA3 in the thickness direction. The first to third sub-patterns LAP1, LAP2 and LAP3 may have shapes similar to the shapes of the openings OPE1, OPE2 and OPE3. In an embodiment, for example, the first to third sub-patterns LAP1, LAP2 and LAP3 may have, but is not limited to, rectangular shapes.

The second pattern BP2 of the light-blocking pattern BM may overlap the reflective pattern RP in the thickness direction. According to an embodiment, the second pattern BP2 of the light-blocking pattern BM may completely overlap the reflective pattern RP in the thickness direction, but the disclosure is not limited thereto. In another embodiment, the second pattern BP2 of the light-blocking pattern BM may partially overlap the reflective pattern RP in the thickness direction. The second pattern BP2 of the light-blocking pattern BM may have a variety of shapes, such as a circle, an oval, a triangle, and other more polygons in a plan view. It should be understood, however, that the embodiments of the disclosure are not limited thereto.

The light-blocking pattern BM may include a light-absorbing material. In an embodiment, for example, the light-blocking pattern BM may include an inorganic black pigment or an organic black pigment. The inorganic black pigment may be, but is not limited to, carbon black, and the organic black pigment may include, but is not limited to, at least one of lactam black, perylene black, and aniline black. The light-blocking pattern BM may effectively prevent visible light from transmitting through areas between the first to fourth emission areas EA1, EA2, EA3 and EA4 to improve the color gamut of the display device 10 by preventing color mixing.

The color filters CF1, CF2 and CF3 of the color filter layer CFL may be disposed on the light-blocking pattern BM and the touch insulating layer TNS2. The plurality of color filters CF1, CF2 and CF3 may include the first color filter CF1, the second color filter CF2 and the third color filter CF3.

The first color filter CF1 may be disposed to overlap the first output area OPT1 and the first emission area EA1 and partially overlap the non-emitting area NEA. The first color filter CF1 may overlap the first reflective layer RPL1 and the first sub-pattern LAP1 in the thickness direction. The first color filter CF1 may selectively transmit the light of the first color (e.g., red light) while blocking or absorbing the light of the second color (e.g., blue light) and the light of the third color (e.g., green light). In an embodiment, for example, the first color filter CF1 may be a red color filter and may include a red colorant. It should be understood, however, that the embodiments of the disclosure are not limited thereto.

The second color filter CF2 may be disposed to overlap the second output area OPT2 and the second emission area EA2 and partially overlap the non-emitting area NEA. The second color filter CF2 may overlap the second reflective layer RPL2 and the second sub-pattern LAP2 in the thickness direction. The second color filter CF2 may selectively transmit the light of the second color (e.g., blue light) while blocking or absorbing the light of the third color (e.g., green light) and the light of the first color (e.g., red light). In an embodiment, for example, the second color filter CF2 may be a blue color filter and may include a blue colorant. It should be understood, however, that the embodiments of the disclosure are not limited thereto.

The third color filter CF3 may be disposed to overlap the third output area OPT3 and the third emission area EA3 and partially overlap the non-emitting area NEA. The third color filter CF3 may overlap the third reflective layer RPL3 and the third sub-pattern LAP3 in the thickness direction. The third color filter CF3 may selectively transmit the light of the third color (e.g., green light) while blocking or absorbing the light of the first color (e.g., red light) and the light of the second color (e.g., blue light). In an embodiment, for example, the third color filter CF3 may be a green color filter and may include a green colorant. It should be understood, however, that the embodiments of the disclosure are not limited thereto.

The overcoat layer OC may be disposed on the color filter layer CFL. The overcoat layer OC may cover the color filter layer CFL to provide a flat surface over the underlying elements having different levels. The overcoat layer OC may be a colorless light-transmitting layer having no color in the visible light band. In an embodiment, for example, the overcoat layer OC may include a colorless light-transmitting organic material such as an acrylic resin and polyimide.

In some embodiments, the overcoat layer OC may further include a dye that can selectively absorb light in a particular wavelength range. The overcoat layer OC can reduce the reflectance of external light by absorbing lights of certain wavelength ranges among lights coming from the outside.

Referring to FIG. 11, according to an embodiment, the second pattern of the light-blocking pattern BM and the reflective pattern RP may be included as described above. The second pattern BP2 of the light-blocking pattern BM may absorb external light coming from the outside. The reflective pattern RP can reduce the reflectance of external light and recycle the light output from the light-emitting element ED.

Specifically, first light ① coming from the outside may be incident on a third sub-pattern LAP3 of the second pattern BP2 of the light-blocking pattern BM and absorbed by the third sub-pattern LAP3. Second light ② coming from the outside may be incident on the inside, then may be reflected off a common electrode CO of the light-emitting element ED and may be reflected again off the third reflection layer RPL3 of the reflective pattern RP, thereby reducing the reflectance of external light due to reflection. In addition, third light ③ output from the light-emitting element ED may be reflected by the third reflective layer RPL3 and then reflected again by the common electrode CO to exit to the outside. That is, the reflective pattern RP allows the third light ③ to exit to the outside without being absorbed in the second pattern BP2. As a result, the display device 10 according to the embodiment can increase the absorption of external light to reduce the reflectance and recycle the light in the reflective pattern RP to increase the emission efficiency.

Referring to FIGS. 12 and 13, according to an embodiment, the reflective pattern RP and the second pattern BP2 of the light-blocking pattern BM may have a horizontal length L1 and a vertical length L2, which are different from each other in a plan view. In such an embodiment, the vertical length L2 may be greater than the horizontal length L1 of each of the reflective pattern RP and the second pattern BP2 of the light-blocking pattern BM. Herein, the ratio (L1:L2) of the vertical length L2 to the horizontal length L1 is referred to as the aspect ratio. In an embodiment, for example, the ratio of the vertical length L2 to the horizontal length L1 of each of the reflective pattern RP and the second pattern BP2 of the light-blocking pattern BM may not be 1:1, for example. In an embodiment, the ratio L2/L1 of the vertical length L2 to the horizontal length L1 may be greater than one. In an embodiment, for example, the reflective pattern RP and the second pattern BP2 of the light-blocking pattern BM may each have a aspect ratio of 1:x in a plan view, where x is greater than one. According to an embodiment of the disclosure, each of the reflective pattern RP and the second pattern BP2 of the light-blocking pattern BM may have an aspect ratio (L1:L2) of 1:1.1, 1:2, 1:3, etc.

The horizontal length L1 may refer to the length of the shorter sides of an imaginary rectangle IRE circumscribing the reflective pattern RP or the second pattern BP2 of the light-blocking pattern BM. The vertical length L2 may refer to the length of the longer sides of the imaginary rectangle IRE. As used herein, the imaginary rectangle IRE circumscribing the reflective pattern RP or the second pattern BP2 of the light-blocking pattern BM means that the sides SS1, SS2, SS3 and SS4 (see FIG. 12) or the vertices PT1, PT2, PT3 and PT4 (see FIG. 13) of the reflective pattern RP or the second pattern BP2 of the light-blocking pattern BM touches the four sides of the imaginary rectangle IRE.

For example, as shown in FIG. 12, an imaginary rectangle IRE touching the two longer sides SS1 and SS2 and the two shorter sides SS3 and SS4 of the reflective pattern RP or second pattern BP2 of the light-blocking pattern BM may be drawn. In this instance, the horizontal length L1 of the reflective pattern RP or the second pattern BP2 of the light-blocking pattern BM may be the length of the shorter sides of the imaginary rectangle IRE, and the vertical length L2 may be the length of the longer sides of the imaginary rectangle IRE.

Referring to FIG. 13, according to another embodiment, the reflective pattern RP and the second pattern BP2 of the light-blocking pattern BM may have an irregular shape. In this instance, a first imaginary rectangle IRE1 touching the first to fourth vertices PT1, PT2, PT3 and PT4 of the reflective pattern RP or the second pattern BP2 of the light-blocking pattern BM, and a second imaginary rectangle IRE2 touching the first, the second, the fifth and the sixth vertices PT1, PT2, PT5 and PT6 may be drawn. Since the first imaginary rectangle IRE1 is smaller than the second imaginary rectangle IRE2, the horizontal length L1 may be the length of the shorter sides of the first imaginary rectangle IRE1, and the vertical length L2 may be the length of the longer sides of the first virtual rectangle IRE1.

Referring to FIG. 14, according to an embodiment of the disclosure, the reflective pattern RP and the second pattern BP2 of the light-blocking pattern BM may overlap the emission area but not overlap the pixel-defining layer PDL in a plan view.

Taking the third emission area EA3 as an example, the third sub-pattern LAP3 and the third reflective layer RPL3 may be disposed in the third emission area EA3. That is, the third sub-pattern LAP3 and the third reflective layer RPL3 may overlap the third emission area EA3. According to an embodiment of the disclosure, the third sub-pattern LAP3 and the third reflective layer RPL3 may overlap the third emission area EA3 but not with the pixel-defining layer PDL.

In a plan view, the vertical length L2 of the reflective pattern RP may be less than or equal to the distance between the both sides of the pixel-defining layer PDL in the extending direction of the vertical length L2. In an embodiment, for example, the vertical length L2 of the reflective pattern RP may be less than or equal to the width PDW of an opening OPE3 of the pixel-defining layer PDL in the extending direction of the vertical length L2.

Figure 15:
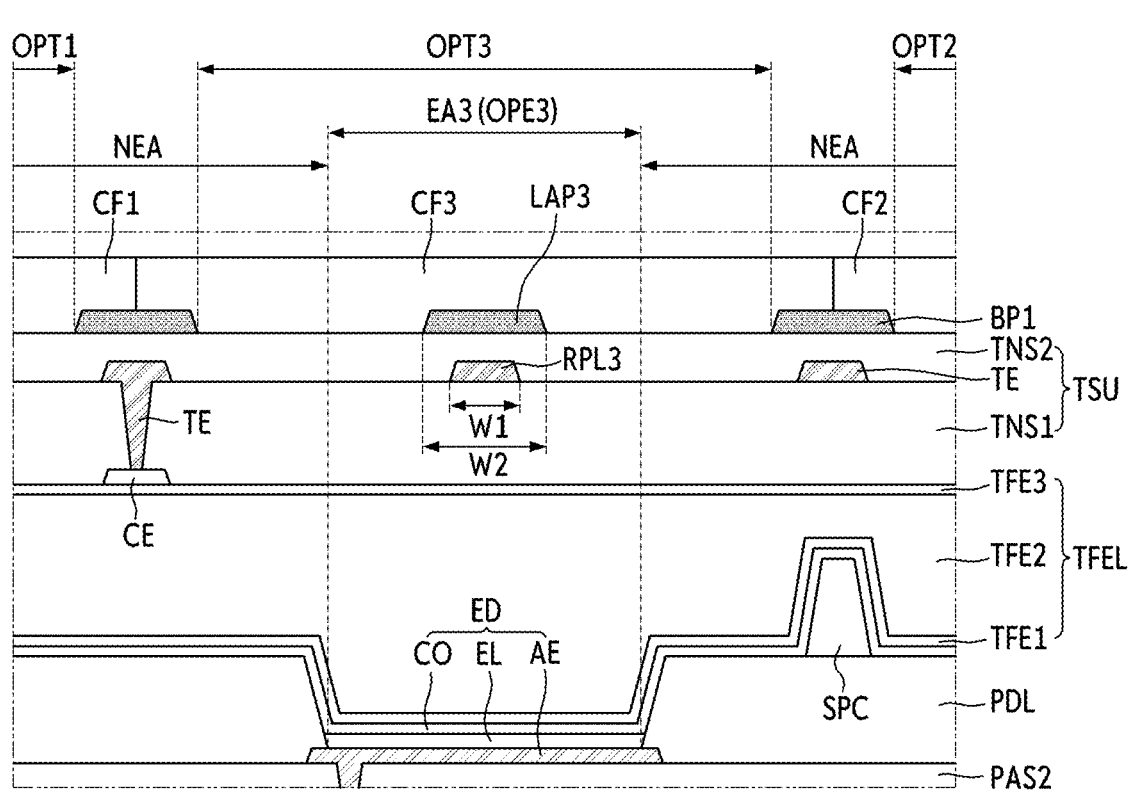
FIG. 15 is a cross-sectional view showing a display device according to another embodiment of the disclosure.
Figure 15:

FIG. 15 is a cross-sectional view showing a display device according to another embodiment of the disclosure. FIG. 15 shows a third emission area EA3 corresponding to FIG. 11. Although the third sub-pattern LAP3 and the third reflective layer RPL3 overlapping the third emission area EA3 will be mainly described as an example, it should be understood that the first and second emission areas EA1 and EA2 also have a same structure as the third emission area EA3.

The embodiment of FIG. 15 is substantially the same as the embodiments of FIGS. 10 to 14 described above except that the width W1 of the third reflective layer RPL3 is smaller than the width W2 of the third sub-pattern LAP3. The following description will focus on the differences and the any repetitive detailed description of the same or like elements as those described above will be omitted.

The third reflective layer RPL3 of the reflective pattern RP may overlap with the third sub-pattern LAP3 of the second pattern BP2 of the light-blocking pattern BM in the thickness direction. According to an embodiment of the disclosure, the width W1 of the third reflective layer RPL3 may be smaller than the width W2 of the third sub-pattern LAP3. The width may be measured in the first direction DR1 and/or the second direction DR2. In an embodiment, for example, the width W1 of the third reflective layer RPL3 measured in the first direction DR1 may be smaller than the width W2 of the third sub-pattern LAP3 measured in the first direction DR1.

According to another embodiment, the width of the third reflective layer RPL3 measured in the second direction DR2 may be smaller than the width W2 of the third sub-pattern LAP3 measured in the second direction DR2. According to yet another embodiment, the widths of the third reflective layer RPL3 measured in the first direction DR1 and the second direction DR2 may be smaller than the widths of the third sub-pattern LAP3 measured in the first direction DR1 and the second direction DR2.

According to still another embodiment, the area of the third reflective layer RPL3 may be smaller than the area of the third sub-pattern LAP3. In an embodiment where the area of the third reflective layer RPL3 is smaller than the area of the third sub-pattern LAP3, the efficiency of lights output from the light-emitting element ED in all directions except the front side may be increased.

Figure 16:
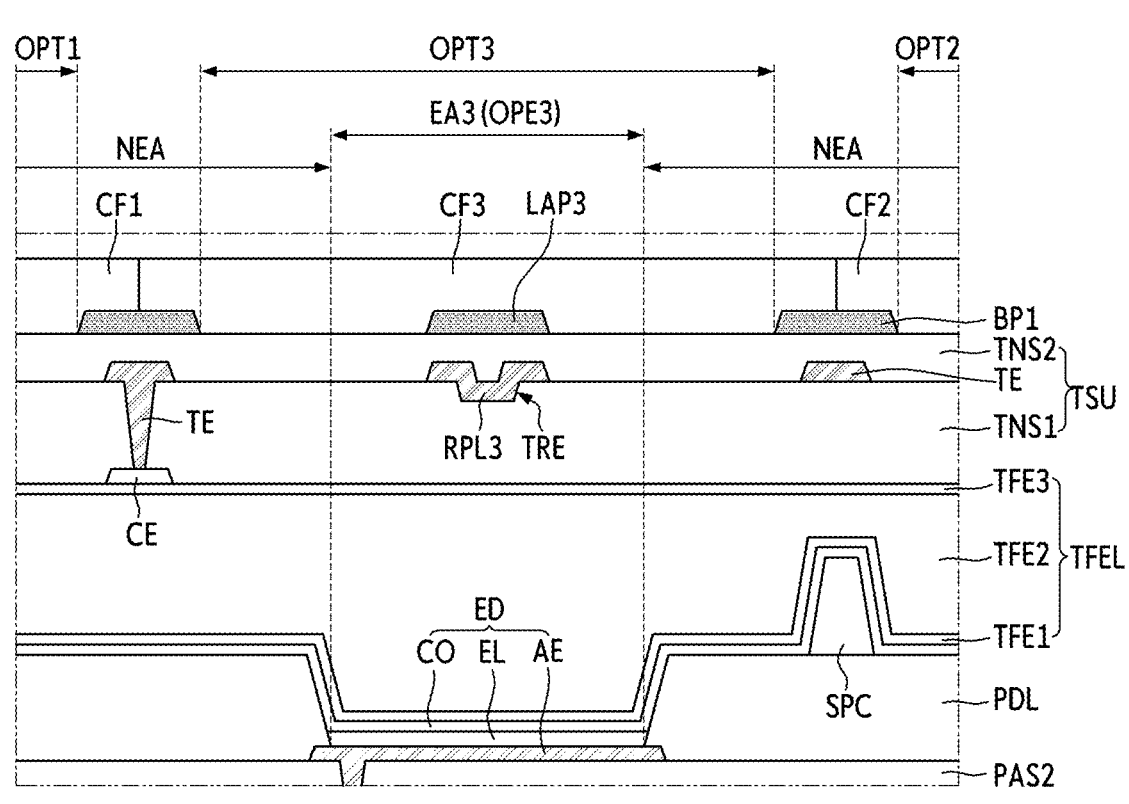
FIG. 16 is a cross-sectional view showing a display device according to yet another embodiment of the disclosure.
Figure 16:

FIG. 16 is a cross-sectional view showing a display device according to yet another embodiment of the disclosure. FIG. 16 shows a third emission area EA3 corresponding to FIG. 11. Although the first touch insulating layer TNS1 and the third reflective layer RPL3 overlapping the third emission area EA3 will be mainly described as an example, it should be understood that the first and second emission areas EA1 and EA2 also have a same structure as the third emission area EA3.

The embodiment of FIG. 16 is substantially the same as the embodiments of FIGS. 10 to 15 described above except that a first touch insulating layer TNS1 includes a trench TRE, and a third reflective layer RPL3 is disposed on the trench TRE.

The first touch insulating layer TNS1 may include the trench TRE. The trench TRE may have a groove shape that is recessed from the upper surface to the lower surface of the first touch insulating layer TNS1. The trench TRE may be formed together with a contact hole for connecting a driving electrode TE with a bridge electrode CE.

The trench TRE may be in line with the third emission area EA3 and the third opening OPE3 but not with the non-emission area NEA. In addition, the trench TRE may be located in the third output area OPT3. The shape of the trench TRE may have the shape shown in FIG. 16, but the disclosure is not limited thereto. The trench may have various shapes such as a hemisphere. The trench TRE may define a space where the third reflective layer RPL3 is disposed on the first touch insulating layer TNS1.

The third reflective layer RPL3 may be disposed directly on the first touch insulating layer TNS1. The third reflective layer RPL3 may be disposed to cover the trench TRE on the first touch insulating layer TNS1. The third reflective layer RPL3 may have a bent shape conforming to the shape of the trench TRE. Accordingly, the third reflective layer RPL3 may be flat where it is in contact with the first touch insulating layer TNS1 and bent where it is in contact with the trench TRE.

Figure 17:
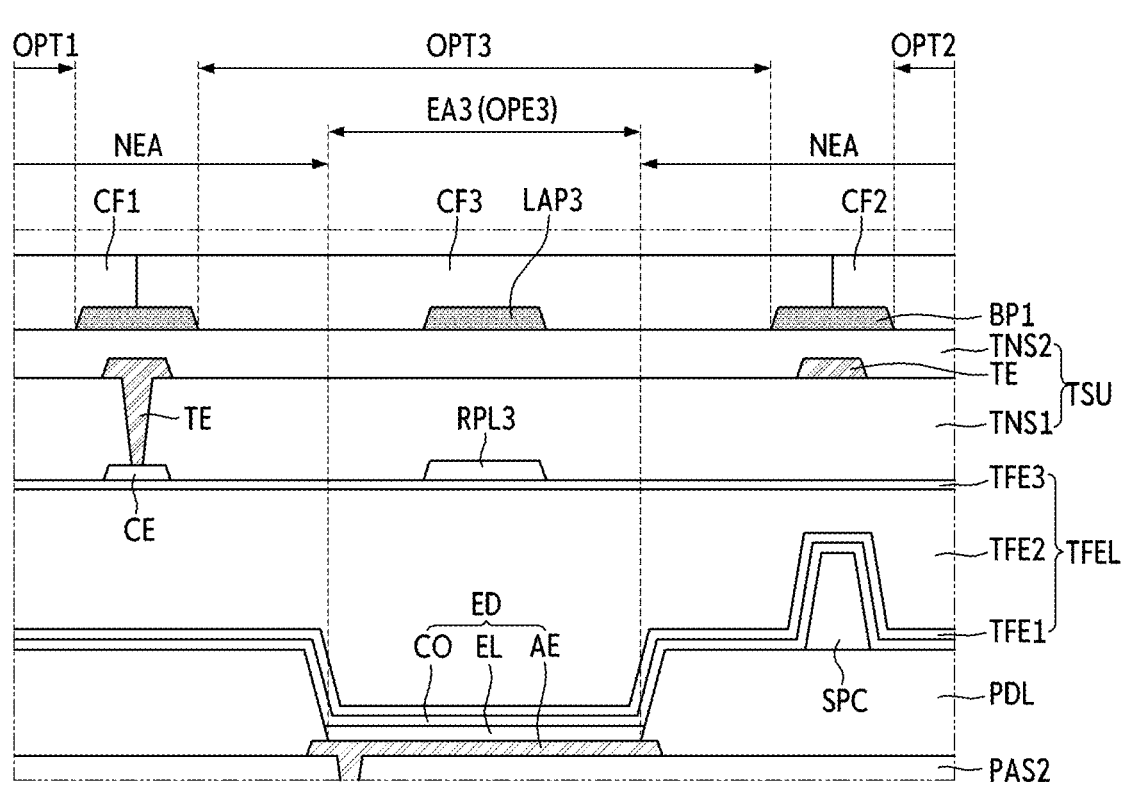
FIG. 17 is a cross-sectional view showing a display device according to yet another embodiment of the disclosure.
Figure 17:

FIG. 17 is a cross-sectional view showing a display device according to yet another embodiment of the disclosure. FIG. 17 shows a third emission area EA3 corresponding to FIG. 11. Although a third reflective layer RPL3 overlapping the third emission area EA3 will be mainly described as an example, it should be understood that the first and second emission areas EA1 and EA2 also have a same structure as the third emission area EA3.

The embodiment of FIG. 17 is substantially the same as the embodiments of FIGS. 10 to 16 described above except that a third reflective layer RPL3 is disposed on a third encapsulation layer TFE3.

The third reflective layer RPL3 may be disposed on the third encapsulation layer TFE3. The third reflective layer RPL3 may be disposed between the third encapsulation layer TFE3 and the first touch insulating layer TNS1. In an embodiment, for example, the third reflective layer RPL3 may be covered by the first touch insulating layer TNS1. The third reflective layer RPL3 may be disposed in a same layer as a bridge electrode CE. The third reflective layer RPL3 may be formed together with the bridge electrode CE.

Hereinafter, simulation examples of the display devices according to the above-described embodiments will be described.

Simulation Example 1

After setting the structure of the display device shown in FIG. 10, the conditions of the reflective pattern RP and the second pattern BP2 of the light-blocking pattern BM were varied depending on Comparative Examples 1, 2 and 3 and Examples 1, 2 and 3 as below.

Examples 1, 2 and 3

The second pattern BP2 of the light-blocking pattern BM and the reflective pattern RP were formed in a rectangular shape with a same area, with different aspect ratios of 1:2, 1:3, and 1:4.

Comparative Example 1

The reflective pattern RP and the second pattern BP2 of the light-blocking pattern BM were eliminated.

Comparative Example 2

The second pattern BP2 of the light-blocking pattern BM and the reflective pattern RP were formed in a circular shape with a same area as in Example 1.

Comparative Example 3

The second pattern BP2 of the light-blocking pattern BM and the reflective pattern RP were formed in a square shape with a same area as in Example 1.

Figure 18:
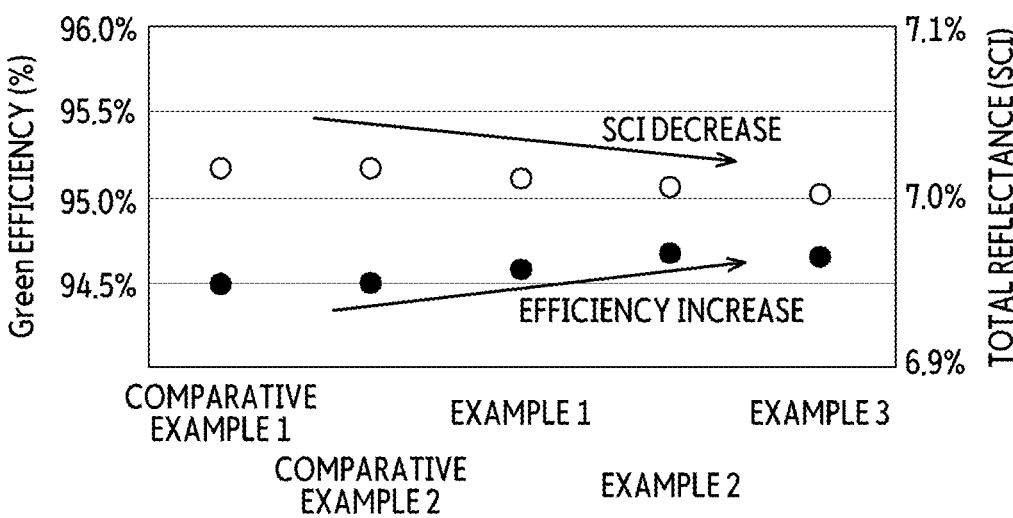
FIG. 18 is a graph showing the green efficiency and the SCI reflectance according to Examples 1, 2 and 3 and Comparative Examples 2 and 3.

Green efficiency and SCI reflectance according to Examples 1, 2 and 3 and Comparative Examples 2 and 3 are shown in FIG. 18. In addition, the red efficiency, the green efficiency, the SCI reflectance, the SCE reflectance, and the front reflectance according to Examples 1, 2 and 3 and Comparative Examples 2 and 3 are shown in Table 1 below. In addition, Table 1 below also shows the SCI reflectance according to Comparative Example 1.

FIG. 18 is a graph showing the green efficiency and the SCI reflectance according to Examples 1, 2 and 3 and Comparative Examples 2 and 3.

TABLE 1

| | Comparative Example 1 | Comparative Example 2 | Comparative Example 3 | Example 1 | Example 2 | Example 3 |
|---|---|---|---|---|---|---|
| Area ($\mu m^2$) | 132.73 | 132.73 | 132.73 | 132.73 | 132.73 | 132.73 |
| Red Efficiency (%) | — | 94.8 | 94.8 | 94.8 | 94.9 | 94.9 |
| Green Efficiency (%) | — | 94.5 | 94.5 | 94.6 | 94.7 | 94.7 |
| SCI(%) | 7.58 | 7.02 | 7.02 | 7.01 | 7.01 | 7.00 |
| SCE(%) | — | 0.75 | 0.75 | 0.75 | 0.75 | 0.75 |
| Front (%) | — | 6.27 | 6.27 | 6.27 | 6.26 | 6.26 |

Referring to Table 1 and FIG. 18, Examples 1, 2 and 3 exhibited the increased green efficiency and the decreased SCI reflectance compared to Comparative Examples 2 and 3. In addition, Examples 1, 2 and 3 exhibited the decreased SCI reflectance compared to Comparative Example 1.

In view of the above, it can be seen that the green efficiency can be increased and the SCI reflectance can be decreased when the vertical and horizontal lengths of the second pattern BP2 of the light-blocking pattern BM and the reflective pattern RP are different from each other.

Simulation Example 2

The second pattern BP2 of the light-blocking pattern BM and the reflective pattern RP were formed with a larger area than Simulation Example 1. The conditions of the second pattern BP2 of the light-blocking pattern BM and the reflective pattern RP were varied depending on Comparative Example 4 and Examples 4, 5 and 6 as below.

Examples 4, 5 and 6

The second pattern BP2 of the light-blocking pattern BM and the reflective pattern RP were formed in a rectangular shape with the same area, with different aspect ratios of 1:2, 1:3, and 1:4.

Comparative Example 4

The second pattern BP2 of the light-blocking pattern BM and the reflective pattern RP were formed in a square shape with a same area as in Example 4.

Figure 19:
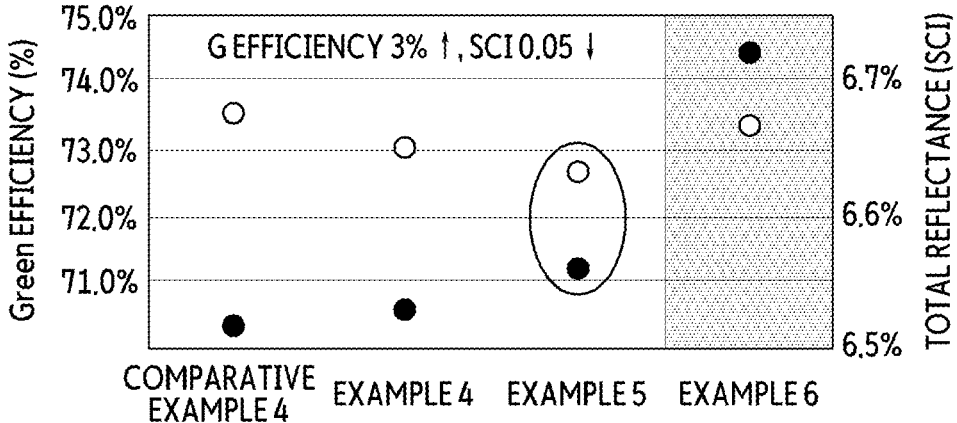
FIG. 19 is a graph showing green efficiency and SCI reflectance according to Examples 4, 5 and 6 and Comparative Example 4 are shown in FIG. 19.

Green efficiency and SCI reflectance according to Examples 4, 5 and 6 and Comparative Example 4 are shown in FIG. 19. In addition, the red efficiency, the green efficiency, the SCI reflectance, the SCE reflectance, and the front reflectance according to Examples 4, 5 and 6 and Comparative Example 4 are shown in Table 2 below.

FIG. 19 is a graph showing green efficiency and SCI reflectance according to Examples 4, 5 and 6 and Comparative Example 4 are shown in FIG. 19.

TABLE 2

| | Comparative Example 4 | Example 4 | Example 5 | Example 6 |
|---|---|---|---|---|
| Area ($\mu m^2$) | 706.86 | 706.86 | 706.86 | 706.86 |
| Red Efficiency (%) | 71.5 | 71.4 | 71.6 | 74.9 |
| Green Efficiency (%) | 70.3 | 70.6 | 71.2 | 74.5 |

TABLE 2-continued

| | Comparative Example 4 | Example 4 | Example 5 | Example 6 |
|---|---|---|---|---|
| SCI(%) | 6.68 | 6.65 | 6.63 | 6.67 |
| SCE(%) | 0.72 | 0.72 | 0.71 | 0.70 |
| Front (%) | 5.96 | 5.93 | 5.92 | 5.97 |

Referring to Table 2 and FIG. 19, Examples 4 and 5 exhibited the increased green efficiency and the decreased SCI reflectance compared to Comparative Example 4. Example 6 exhibited the tendency that the SCI reflectance did not decrease, unlike Examples 4 and 5. It was determined that this occurred because the second pattern BP2 of the light-blocking pattern BM and the reflective pattern RP overlap the pixel-defining layer beyond the emission area. Accordingly, the disclosure shows that the second pattern BP2 of the light-blocking pattern BM and the reflective pattern RP may be desired to be formed in a way such that the second pattern BP2 of the light-blocking pattern BM and the reflective pattern RP do not overlap the pixel-defining layer.

In view of the above, it can be seen that even though the area of the second pattern BP2 of the light-blocking pattern BM and the reflective pattern RP is increased, the green efficiency can be increased and the SCI reflectance can be decreased when the vertical and horizontal lengths are different from each other.

Simulation Example 3

After forming the second pattern BP2 of the light-blocking pattern BM and the reflective pattern RP according to Example 1, the distance between a common electrode CO of a light-emitting element ED and the reflective pattern RP was adjusted. The omnidirectional efficiency and the frontal efficiency of green, and the omnidirectional efficiency and the frontal efficiency of red were measured and shown in FIG. 20 and Table 3 below.

Figure 20:
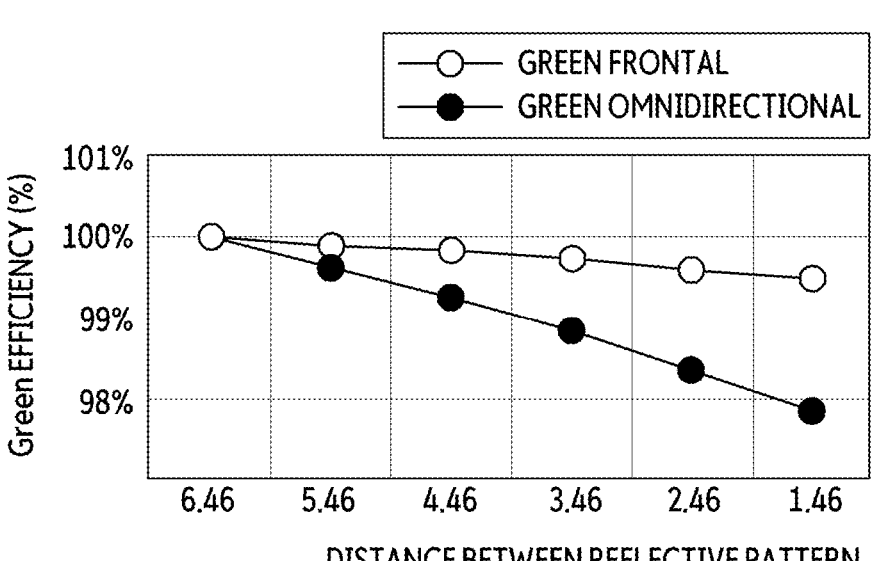
FIG. 20 is a graph showing the efficiency versus the distance between the common electrode and the reflective pattern.

FIG. 20 is a graph showing the efficiency versus the distance between the common electrode and the reflective pattern.

TABLE 3

| | | Distance between common electrode CO and reflective pattern RP ($\mu m$) | | | | | |
|---|---|---|---|---|---|---|---|
| | | 6.46 | 5.46 | 4.46 | 3.46 | 2.46 | 1.46 |
| Green Efficiency (%) | Omnidirectional | 100 | 99.6 | 99.2 | 98.8 | 98.4 | 97.8 |
| | Frontal | 100 | 99.9 | 99.8 | 99.7 | 99.6 | 99.5 |

TABLE 3-continued

| | | Distance between common electrode CO and reflective pattern RP (μm) | | | | | |
| --- | --- | --- | --- | --- | --- | --- | --- |
| | | 6.46 | 5.46 | 4.46 | 3.46 | 2.46 | 1.46 |
| Red | Omnidirectional | 100 | 99.7 | 99.3 | 98.9 | 98.4 | 97.9 |
| Efficiency (%) | Frontal | 100 | 99.9 | 99.8 | 99.7 | 99.6 | 99.5 |

Referring to Table 3 and FIG. 20, as the distance between the reflective pattern RP and the common electrode CO increased, the omnidirectional efficiency and the frontal efficiency of green and red increased. Increasing the distance between the reflective pattern RP and the common electrode CO may imply that the size of the reflective pattern RP decreases.

Based on these results, it can be seen that as the size of the reflective pattern RP decreases, the omnidirectional efficiency and the frontal efficiency of green and red increase.

The display device according to one embodiment of the present disclosure can be applied to various electronic devices. The electronic device according to the one embodiment of the present disclosure includes the display device described above, and may further include modules or devices having additional functions in addition to the display device.

Figure 21:
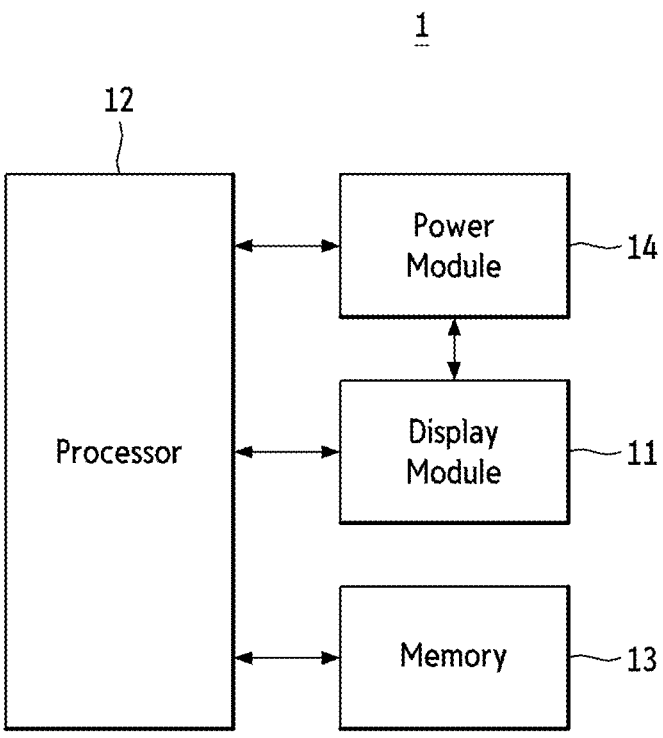
FIG. 21 is a block diagram of an electronic device according to one embodiment of the present disclosure.

FIG. 21 is a block diagram of an electronic device according to one embodiment of the present disclosure.

Referring to FIG. 21, the electronic device 1 according to one embodiment of the present disclosure may include a display module 11, a processor 12, a memory 13, and a power module 14.

The processor 12 may include at least one of a central processing unit (CPU), an application processor (AP), a graphic processing unit (GPU), a communication processor (CP), an image signal processor (ISP), and a controller.

The memory 15 may store data information necessary for the operation of the processor 12 or the display module 11. When the processor 12 executes an application stored in the memory 15, an image data signal and/or an input control signal is transmitted to the display module 11, and the display module 11 can process the received signal and output image information through a display screen.

The power module 14 may include a power supply module such as, for example a power adapter or a battery, and a power conversion module that converts the power supplied by the power supply module to generate power necessary for the operation of the electronic device 1.

At least one of the components of the electronic device 11 according to the one embodiment of the present disclosure may be included in the display device 10 according to the embodiments of the present disclosure. In addition, some modules of the individual modules functionally included in one module may be included in the display device 10, and other modules may be provided separately from the display device 10. For example, the display device 10 may include the display module 11, and the processor 12, the memory 13, and the power module 14 may be provided in the form of other devices within the electronic device 11 other than the display device 10.

Figure 22:
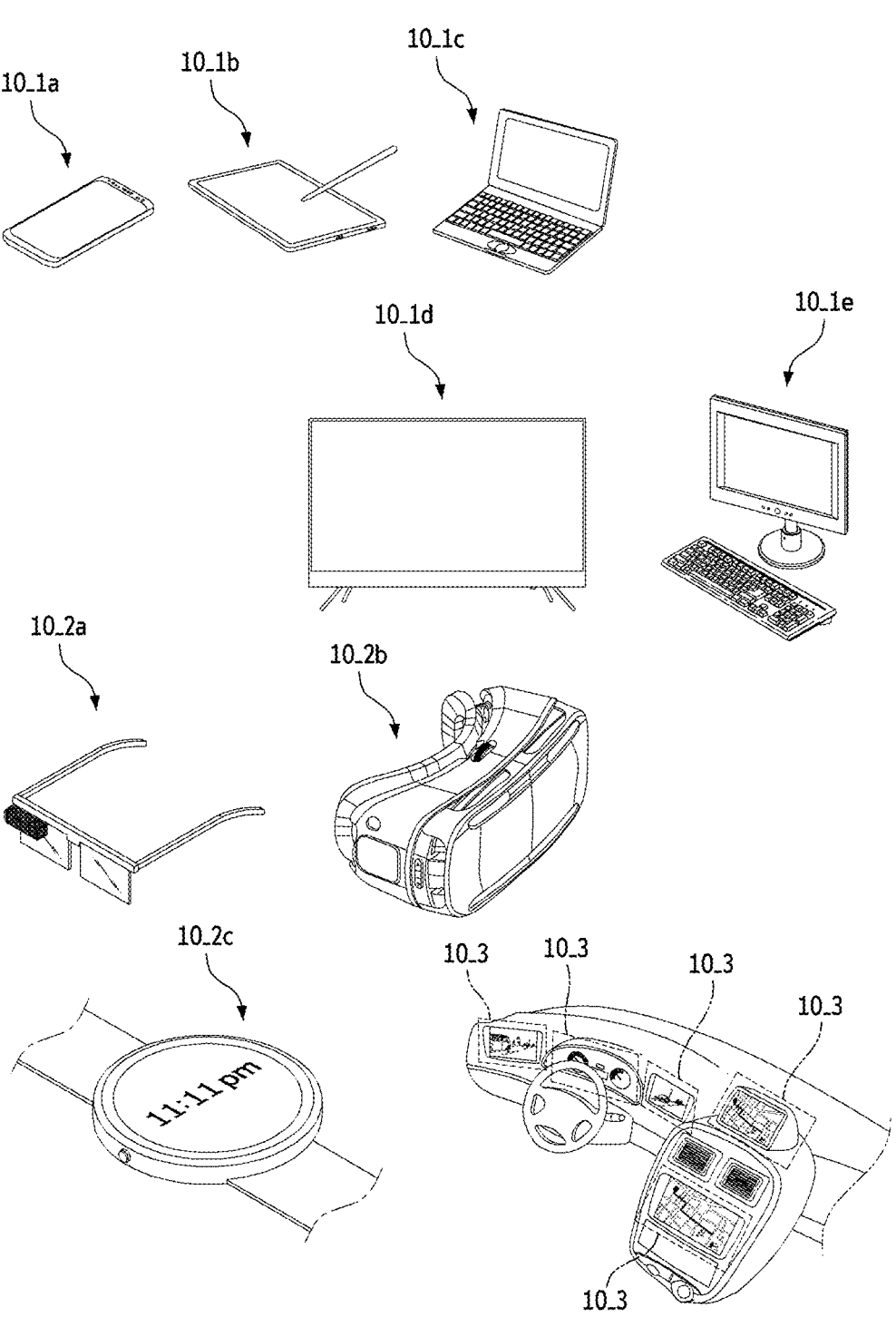
FIG. 22 is a schematic diagram of an electronic device according to various embodiments of the present disclosure.

FIG. 22 is a schematic diagram of an electronic device according to various embodiments of the present disclosure.

Referring to FIG. 22, various electronic devices to which display devices 10 according to embodiments of the present disclosure are applied may include not only image display electronic devices such as a smart phone 10_1a, a tablet PC (personal computer) 10_1b, a laptop 10_1c, a TV 10_1d, and a desk monitor 10_1e, but also wearable electronic devices including display modules such as, for example smart glasses 10_2a, a head mounted display 10_2b, and a smart watch 10_2c, and vehicle electronic devices 10_3 including display modules such as a CID (Center Information Display) and a room mirror display arranged on a dashboard, center fascia, and dashboard of an automobile.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display layer comprising a light-emitting element and a pixel-defining layer;
a touch sensing layer disposed on the display layer and comprising a touch insulating layer and a reflective pattern; and
a light-blocking pattern disposed on the touch sensing layer and comprising a first pattern overlapping the pixel-defining layer and a second pattern overlapping the reflective pattern,
wherein the reflective pattern and the second pattern each overlap the light-emitting element in a plan view,
wherein the reflective pattern and the second pattern each have a vertical length and a horizontal length different from each other in the plan view, and
wherein the pixel-defining layer defines an emission area and a non-emission area, a planar shape of the emission area is circular, elliptical, or polygonal having four or more sides, and a planar shape of each of the reflective pattern and the second pattern is elliptical or polygonal having four or more sides.

2. The display device of claim 1, wherein the reflective pattern and the second pattern overlap the emission area.

3. The display device of claim 2, wherein the first pattern does not overlap the emission area, and the first pattern overlaps the non-emission area.

4. The display device of claim 1, wherein
the touch sensing layer comprises a driving electrode disposed on the touch insulating layer, and
the driving electrode and the reflective pattern are disposed in a same layer as each other.

5. The display device of claim 1, wherein
the touch sensing layer comprises a driving electrode, a sensing electrode and a bridge electrode, and
the reflective pattern is spaced apart from the driving electrode, the sensing electrode and the bridge electrode in the plan view.

6. The display device of claim 1, wherein an area of the reflective pattern is equal to an area of the second pattern.

7. The display device of claim 1, wherein a shape of the reflective pattern is identical to a shape of the second pattern in the plan view.

8. The display device of claim 1, wherein the vertical length is greater than the horizontal length in the plan view.

9. The display device of claim 1, wherein a width of the reflective pattern in a direction is less than a width of the second pattern in the direction.

10. The display device of claim 1, wherein an area of the reflective pattern is less than an area of the second pattern.

11. The display device of claim 1, wherein the touch insulating layer comprises a trench formed in an upper surface, and the reflective pattern is disposed on the trench.

12. The display device of claim 1, wherein the display layer comprises a thin-film encapsulation layer disposed between the light-emitting element and the touch sensing layer, the touch sensing layer comprises a bridge electrode disposed between the thin-film encapsulation layer and the touch insulating layer, and the bridge electrode and the reflective pattern are disposed in a same layer as each other.

13. The display device of claim 1, wherein the second pattern is spaced apart from the first pattern and is surrounded by the first pattern in the plan view.

14. The display device of claim 1, wherein the light-emitting element comprises a pixel electrode, the pixel-defining layer is provided with an opening exposing the pixel electrode, and the reflective pattern is disposed in a central area of the opening of the pixel-defining layer in the plan view.

15. The display device of claim 1, wherein the vertical length of the reflective pattern is less than or equal to a distance between opposing sides of the pixel-defining layer, which are opposite to each other in an extension direction of the vertical length.

16. A display device comprising:

a display layer comprising an emission area and a non-emission area;

a touch sensing layer disposed on the display layer and comprising a driving electrode overlapping the non-emission area and a reflective pattern overlapping the emission area in a plan view; and a light-blocking pattern disposed on the touch sensing layer and comprising a first pattern overlapping the non-emission area and a second pattern overlapping the emission area in the plan view, wherein the reflective pattern and the second pattern each have a vertical length greater than a horizontal length in the plan view, and wherein the pixel-defining layer defines an emission area and a non-emission area, a planar shape of the emission area is circular, elliptical, or polygonal having four or more sides, and a planar shape of each of the reflective pattern and the second pattern is elliptical or polygonal having four or more sides.

17. The display device of claim 16, wherein an area of the reflective pattern is equal to an area of the second pattern.

18. The display device of claim 16, wherein an area of the reflective pattern is less than an area of the second pattern.

19. The display device of claim 16, wherein a shape of the reflective pattern is identical to a shape of the second pattern in the plan view.

20. The display device of claim 16, wherein the touch sensing layer comprises a touch insulating layer disposed on the display layer, and the driving electrode and the reflective pattern are disposed directly on the touch insulating layer.

21. An electronic device, comprising:

a display device configured to provide an image;

a processor configured to provide an image data signal to the display device;

a memory configured to store a data information for operation; and a power module configured to generate power, wherein the display device comprises:

a display layer comprising a light-emitting element and a pixel-defining layer;

a touch sensing layer disposed on the display layer and comprising a touch insulating layer and a reflective pattern; and a light-blocking pattern disposed on the touch sensing layer and comprising a first pattern overlapping the pixel-defining layer and a second pattern overlapping the reflective pattern, wherein the reflective pattern and the second pattern each overlap the light-emitting element in a plan view, wherein the reflective pattern and the second pattern each have a vertical length and a horizontal length different from each other in the plan view, and wherein the pixel-defining layer defines an emission area and a non-emission area, a planar shape of the emission area is circular, elliptical, or polygonal having four or more sides, and a planar shape of each of the reflective pattern and the second pattern is elliptical or polygonal having four or more sides.

* * * * *